US011088661B2

(12) United States Patent
Hill

(10) Patent No.: US 11,088,661 B2
(45) Date of Patent: Aug. 10, 2021

(54) POWER AMPLIFIER DEVICES CONTAINING INVERTED POWER TRANSISTOR DIES AND METHODS FOR THE FABRICATION THEREOF

(71) Applicant: NXP USA, Inc., Austin, TX (US)

(72) Inventor: Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 95 days.

(21) Appl. No.: 16/516,540

(22) Filed: Jul. 19, 2019

(65) Prior Publication Data

US 2021/0021237 A1    Jan. 21, 2021

(51) Int. Cl.
*H03F 3/14* (2006.01)
*H03F 3/68* (2006.01)
*H03F 1/02* (2006.01)
*H03F 3/213* (2006.01)
*H03F 3/21* (2006.01)

(52) U.S. Cl.
CPC ........... *H03F 1/0288* (2013.01); *H03F 3/211* (2013.01); *H03F 3/213* (2013.01)

(58) Field of Classification Search
CPC ........ H03F 1/0288; H03F 3/211; H03F 3/213; H03F 3/602; H03F 3/604; H03F 3/195; H01L 2924/3011; H01L 23/66
USPC ..................... 330/124 R, 295, 307
See application file for complete search history.

(56) References Cited

U.S. PATENT DOCUMENTS

| | | | |
|---|---|---|---|
| 9,787,254 B2 | 10/2017 | Abdo et al. | |
| 9,800,209 B2 | 10/2017 | Li | |
| 10,075,132 B2 | 9/2018 | Jones et al. | |
| 10,103,233 B1 | 10/2018 | Khalil et al. | |
| 10,734,303 B2* | 8/2020 | Odnoblyudov | H01P 3/003 |
| 2014/0070881 A1* | 3/2014 | Annes | H03F 3/193 330/2 |
| 2017/0077051 A1* | 3/2017 | Sanders | H01L 28/10 |

OTHER PUBLICATIONS

Kuo, Che-Chjung et al; "A 3.5-GHz SiGe 0.35um HBT Flip-Chip Assembled on Ceramics Integrated Passive Device Doherty Power Amplifier for SiP Integration"; Proceedings of the Asia-Pacific Microwave Conference 2011; 4 pages (2011).

(Continued)

*Primary Examiner* — Khanh V Nguyen

(57) ABSTRACT

Power amplifier (PA) devices and methods for fabricating PA devices containing inverted power transistor dies are disclosed. In embodiments, the PA device includes a first set of input and output leads, an inverted first power transistor (e.g., peaking) die electrically coupled between the first set of input and output leads, and a base flange. The inverted first power die includes, in turn, a die body having a die frontside and a die backside opposite the die frontside. A power transistor having a first contact region is formed in the die frontside. A frontside layer system is formed over the die frontside and the power transistor, while an electrically-conductive bond layer attaches the inverted first power transistor die to the base flange. The first contact region of the power transistor is electrically coupled to the base flange through the electrically-conductive bond layer and through the frontside layer system.

20 Claims, 11 Drawing Sheets

(56) References Cited

OTHER PUBLICATIONS

Hill, Darrell et al; "28-V Low Thermal-Impedance HBT with 20-W CW Output Poser"; IEEE Transactions on Micorwave Theory and Techniques, vol. 45, No. 12; 5 pages (Dec. 1997).

Hill, Darrell et al; "Three-Dimensional MMIC Architecture Using Low Thermal Impedance Technology"; IEEE MTT-S Digest; 4 pages (1998).

Xu, Jane; "GaN HEMTs based Flip-chip Integrated Broadband Power Amplifier"; University of California at Santa Barbara, ONR MURI Center Impact—Innovative Microwave Power Amplifier Consortium Center; retreived from the Internet https://my.ece.ucsb.edu/Mishra/ganitrideelec/xudefense.pdf; 72 pages (Dec. 2000).

\* cited by examiner

POWER AMPLIFIER DEVICES CONTAINING INVERTED POWER TRANSISTOR DIES AND METHODS FOR THE FABRICATION THEREOF

TECHNICAL FIELD

Embodiments of the present invention relate generally to microelectronics and, more particularly, to power amplifier (PA) devices (e.g., Doherty PA packages and modules) containing inverted power transistor (e.g., peaking) dies, as well as to methods for fabricating such PA devices.

ABBREVIATIONS

Abbreviations appearing relatively infrequently in this document are defined upon initial usage, while abbreviations appearing more frequently in this document are defined below:
- FET—field effect transistor;
- IC—integrated circuit;
- IPD—integrated passive device;
- MN—matching network;
- PA—power amplifier; and
- RF—radio frequency.

BACKGROUND

Wireless communication systems, such as cellular base stations, often incorporate microelectronic devices and associated circuitry implementing Doherty PAs to boost the strength of RF signals. Such devices are referred to herein as "Doherty PA devices" and can be implemented as modules, packages, or the like. Traditionally, Doherty PA devices are fabricated to contain one carrier amplifier and one peaking amplifier arranged in a symmetric or asymmetric, two-way, dual path configuration. While symmetric two-way Doherty architectures remain common, more complex Doherty architectures are now increasingly employed for enhanced performance. Three- and four-way Doherty PA devices with symmetric and asymmetric layouts, for example, now enjoy widespread commercial availability. With respect to Doherty PA devices having asymmetric layouts, in particular, a greater share of available die bond area is typically allotted to the peaking amplifier die (or dies) as compared to the carrier amplifier die. This allows an increase in the size (active periphery or total active gate width) of the peaking amplifier die (or dies) within the Doherty PA device relative to the carrier amplifier die to bring about enhancements in gain, linearity, stability, and power-added efficiency levels of the device.

While modern Doherty PA devices perform well, generally considered, industry demands continue to seek manners in which to improve the reliability of Doherty PA devices, while reducing the manufacturing costs thereof. These criteria are largely antagonistic. Doherty PA device reliability is heavily impacted by the thermal performance of the PA device; that is, the ability of the PA device to reject excess heat at a rate sufficient to prevent device overheating during operation. Thermal performance is particularly vital in the case of the carrier die within a given Doherty PA device, which may be required to dissipate several times more heat than the less active peaking die (or dies) within the device. Perhaps the most direct manner by which the heat dissipation capabilities of a given carrier die can be enhanced is through an increase in the overall size or mass of the carrier die. As the size of the carrier die increases, however, so too does the manufacturing cost of the carrier die and the Doherty PA device. Consequently, it is often the heat dissipation needs of the carrier die, rather than design rules or other concerns, that ultimately determines the final sizing and cost point of the carrier die within a Doherty PA device. Comparatively, the peaking die (or dies) are typically size-limited by the dimensions of the active area availed for formation of the peaking transistor(s) integrated within the peaking die(s), rather than by thermal performance concerns.

BRIEF DESCRIPTION OF THE DRAWINGS

At least one example of the present invention will hereinafter be described in conjunction with the following figures, wherein like numerals denote like elements, and.

Figure 1:
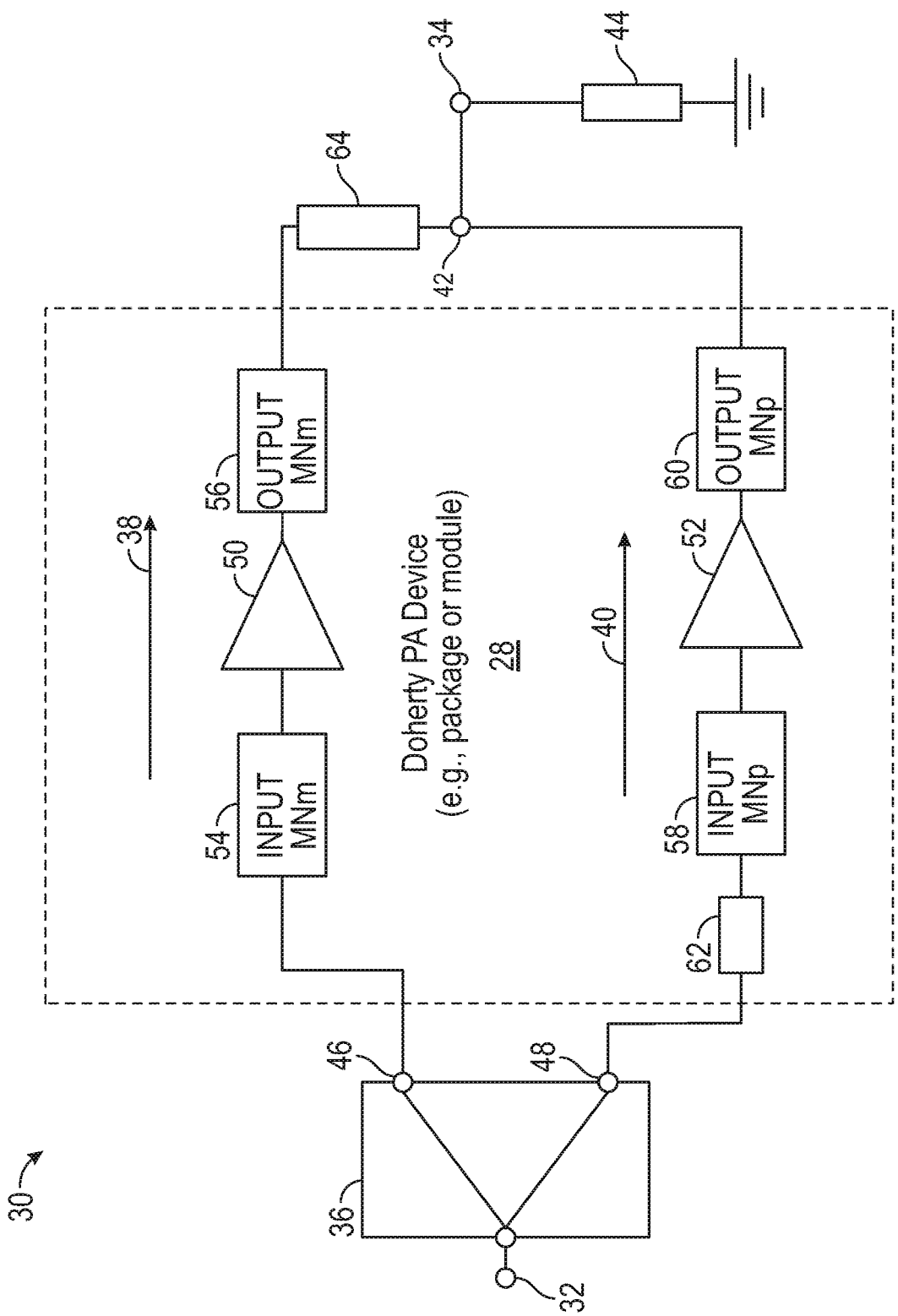
FIG. 1 is a simplified schematic diagram of a Doherty PA circuit structure, which may be partially implemented within a Doherty PA package or module, as illustrated in accordance with an example embodiment.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

As appearing herein, statements indicating that a first layer is "bonded to," is "formed over," or is "formed on" a second layer or surface (e.g., the frontside or backside of the body of a semiconductor die) do not require that the first layer is directly bonded to or intimately contacts the second layer or surface unless otherwise expressly stated. In this regard, the terms "over" and "on" do not require direct physical contact between a first layer formed "over" or "on" a second layer (or a named surface), unless indicated by an express statement to this effect; e.g., a statement indicating that the first layer is formed "directly on" or is formed "in contact with" the second layer (or surface). Further, the terms "over" and "on," as appearing throughout this document, are utilized without restriction as to orientation; e.g., as an example, a first layer located beneath a second layer may be described as "formed over" the second layer when the first layer is deposited on, grown on, or otherwise created on the second layer.

Definitions

The following definitions apply throughout this document. Those terms not expressly defined here or elsewhere in this document are assigned their ordinary meaning in the relevant technical field.

Backmetal layer—a layer formed over the backside (the "passive side") of the body of a semiconductor die and predominately composed of one or more metals, by weight.

Frontmetal layer—a layer formed over the frontside (the transistor-bearing or "active" side) of the body of a semiconductor die and predominately composed of one or more metals, by weight.

Frontside layer system—a system or structure comprised of multiple material layers formed over the frontside of the body a semiconductor die.

Power Amplifier (PA) device—a microelectronic device, such as a package or module, containing at least one power transistor die utilized to amplify an RF signal or other electrical signal.

Through Substrate Via (TSV)—a via structure, such as an internally-plated via or a metal-filled via, providing an electrically-conductive path at least partially through the body of a semiconductor die. The more specific term "Through Wafer Via," or "TWV," is also utilized herein to refer to a TSV formed in one or more semiconductor dies prior to singulation; that is, while the semiconductor dies remain interconnected in wafer form.

Transistor Integrated Circuit (IC)—a general term encompassing a circuit structure formed on a semiconductor die, which includes at least one transistor and the terminals or contact regions associated therewith. The term "transistor IC" may thus include a single transistor (with or without other active circuit elements) or multiple transistors interconnected to form the desired circuit structure.

Overview

The following describes PA devices containing inverted power transistor (e.g., peaking) dies and other associated structural features, as well as methods for fabricating PA devices containing inverted peaking dies. In many instances, the PA devices assume the form of Doherty PA devices, such as Doherty PA packages or modules, and are principally described below as such. Embodiments of the present disclosure are not so limited, however. Instead, the present teachings are applicable to any microelectronic device (e.g., package or module) into which an inverted amplifier or power transistor (e.g., peaking) die is usefully integrated including, for example, Doherty PA devices and single package push-pull type PA devices. A given PA device may contain a single inverted power transistor die or, perhaps, may contain multiple inverted power transistor dies; e.g., as may be the case when the PA device assumes the form of a Doherty PA device having an N-way amplifier layout (N>2) and contains two or more peaking transistors formed on separate or discrete semiconductor dies. When containing an inverted peaking die, embodiments of the PA device will also often contain a single carrier die (or multiple carrier dies) having a conventional (non-inverted) orientation. In some instances, however, the carrier die (or dies) within the PA device may likewise be imparted with an inverted orientation depending upon certain factors, such as the thermal conductivity and heat dissipation needs of the carrier die(s). In either case, the below-described PA devices are generally amenable to fabrication utilizing existing manufacturing equipment and may be produced with relatively minor modifications to established manufacturing process flows, streamlining low cost adoption.

Multiple benefits can be realized through inversion of the power transistor (e.g., peaking) die or dies contained in a given PA device, when enabled by other complementary structural features. As a principal benefit, and referring specifically to peaking dies as an example, inversion of the peaking die(s) enables an appreciable increase in the active transistor dimensions (the transistor periphery or total active gate width) relative to the planform dimensions of the peaking die. This is due, at least in part, to the relocation of certain bond pad structures (e.g., drain and gate bond pad structures in the case of a peaking FET) to the backside of the peaking die, thereby freeing additional active area across the die frontside for enlargement of the peaking transistor formed within the die without requiring an increase in die size. A reduction in the overall size of the peaking die is consequently permitted, while the dimensions of the peaking transistor are held constant (or perhaps increased to some extent) to bring about cost savings absent a corresponding performance penalty. Indeed, reducing the peaking die size in this manner can greatly decrease the overall production cost of the peaking die, often in nearly a 1:1 proportion with the die size reduction. In many instances, peaking die size (and peaking die manufacture costs) can be reduced by 20% or more when fabricated in accordance with the teachings set-forth herein. Concurrently, the reliability of the inverted, reduced-size peaking die is maintained at optimal levels considering, for example, that peaking die size (as opposed to carrier die size) is rarely constrained by thermal limitations; e.g., the peaking die is typically required to dissipate only a fraction of the heat dissipated by the carrier die within a given PA device. This is particularly true in the context of asymmetric PA devices in which the peaking die is imparted with planform dimensions exceeding those of the carrier die, often by a ratio of 2:1 or more.

In addition to having an inverted orientation, the power transistor (e.g., peaking) die or dies within a given PA device may differ from conventional dies in other respects, as well. For example, in embodiments, an inverted peaking die may include at least one backmetal layer patterned to define at least first and second electrically-isolated bond pad structures. In such embodiments, electrically-conductive elements, such as TSVs formed through the body of the inverted peaking die, may be provided to electrically couple: (i) the first bond pad structure to a first frontside contact structure electrically connected to a first terminal of a peaking transistor, and (ii) the second bond pad structure to a second frontside contact structure connected to a second terminal of a peaking transistor. When the peaking transistor is realized as a FET (as opposed to a bipolar transistor or another type of transistor), the first frontside contact structure may assume the form of a gate contact structure including a frontside gate manifold and gate contacts, while the second frontside contact structure may assume the form of a drain contact structure including a frontside drain manifold and drain contacts.

In embodiments of the inverted peaking die, an outer frontmetal layer may be formed over the first and second frontside (e.g., gate and drain) contact structures, while a relatively thick frontside dielectric layer is provided between the outer frontmetal layer and the contact structures. When provided, the frontside dielectric layer is usefully imparted with a thickness sufficient to provide electrical isolation between the first frontside (e.g., gate) contact structure, the second frontside (e.g., drain) contact structure, and the outer frontmetal layer of the inverted peaking die. Further, in at least some implementations, the frontside dielectric layer may be patterned to define openings through which the outer frontmetal layer extends to physically and electrically contact third contact (e.g., source) region(s) of the peaking transistor (or transistors) formed in the frontside of the peaking die body. The outer frontmetal layer may also lend itself to the formation of a structurally-robust, high conductivity bond with the electrically-conductive bond material utilized to attach the peaking die to a base flange (or other substrate) contained in the PA device; e.g., in certain embodiments, the outer frontmetal layer may form a metallurgical bond with a solder, a metal-filled epoxy, or a sintered material utilized to attach the peaking die (or dies) to the base flange.

Various other benefits may further be provided by embodiments of the PA devices and inverted peaking dies (or other power transistor dies) described herein. For example, in embodiments in which the inverted peaking die carries a peaking transistor (e.g., a microwave power FET) having source regions, the source regions of the transistor may be coupled to electrical ground through the electrically-conductive bond layer and the base flange, the latter of which may serve as a ground terminal of the PA device. In such implementations, inversion of the peaking die may enable the creation of a relatively direct, low inductance electrical path between the source region(s) of the peaking transistor and the electrically-conductive base flange. The power gain of the Doherty PA device may be increased as a result.

Turning now to the accompanying drawing figures, description of example PA devices (specifically, Doherty PA packages) containing at least one inverted peaking die is set-forth below in connection with FIGS. 3-11. First, however, a general description of Doherty PA devices (packages and modules) is set-forth below in conjunction with FIGS. 1 and 2 to establish an exemplary, albeit non-limiting context in which embodiments of the present disclosure may be better understood. While the following description focuses on Doherty PA devices containing at least one inverted peaking die and at least one carrier die, which may or may not be inverted, the following description provides teachings broadly applicable to various different types of PA devices containing one or more inverted power transistor dies.

General Discussion of Example Doherty PA Devices

FIG. 1 is a simplified schematic diagram of a Doherty PA circuit 30, as illustrated in accordance with an example embodiment of the present disclosure. As indicated by a dashed box 28, the illustrated Doherty PA circuit 30 may be partially integrated into a Doherty PA device, such as a Doherty PA package or module. The Doherty PA circuit 30 includes an input node 32, an output node 34, and a power divider 36 (or splitter) between the nodes 32, 34. The Doherty PA circuit 30 further includes a main or "carrier" amplifier signal path (represented by arrow 38), an auxiliary or "peaking" signal amplification path (represented by arrow 40), and a combining node 42 at which the signal amplification paths 38, 40 converge. A load 44 may be coupled to the combining node 42, such as through a non-illustrated impedance transformer, to receive an amplified RF signal from the Doherty PA circuit 30. The Doherty PA circuit 30 may be beneficially incorporated in a larger, non-illustrated PA system, such as a cellular base station or other wireless communication system.

The power divider 36 is configured to divide the power of an input RF signal received at the input node 32 into carrier and peaking portions (herein, "a carrier input signal" and a "peaking input signal"). The carrier input signal is provided to the carrier amplification path 38 via the power divider output 46, while the peaking input signal is provided to the peaking amplification path 40 via the power divider output 48. When operating in a full-power mode in which the carrier and peaking amplifiers 50, 52 concurrently supply current to the load 44, the power divider 36 apportions the input signal power between the signal amplification paths 38, 40. When the illustrated circuit 30 is imparted with a symmetric Doherty PA configuration, the power divider 36 may apportion power in a substantially equal manner, such that approximately one half of the input signal power is provided to each signal amplification path 38, 40. In other instances, such as when the illustrated circuit 30 is imparted with an asymmetric Doherty PA configuration, the power divider 36 may apportion power unequally between the signal amplification paths 38, 40. Essentially, then, the power divider 36 divides an input RF signal supplied at the input node 32, with the divided signal portions then separately amplified along the carrier (main) and peaking (auxiliary) amplification paths 38, 40.

The carrier amplifier 50 and the peaking amplifier 52 each include at least one power transistor IC for amplifying RF signals conducted through the amplifiers 50, 52. Each power transistor IC may be fabricated on a semiconductor die and imparted with either a single-stage or multi-stage configuration. In embodiments, all amplifier stages (or a final amplifier stage) of either or both the carrier amplifier 50 and the peaking amplifier 52 may be implemented utilizing any of the following: a silicon-based FET (e.g., a laterally-diffused metal oxide semiconductor FET or LDMOS FET) or a III-V FET (e.g., a gallium nitride (GaN) FET, a gallium arsenide (GaAs) FET, a gallium phosphide (GaP) FET, an indium phosphide (InP) FET, or an indium antimonide (InSb) FET, or another type of III-V transistor). The carrier and peaking transistor ICs may be equally sized when, for example, the circuit 30 has a symmetric Doherty configuration. Alternatively, the carrier and peaking transistor ICs may have unequal sizes in the case of various asymmetric Doherty configurations; it being understood that the term "size," as appearing in this context, is utilized in reference to the active periphery or total active gate width of the power transistor ICs. In an asymmetric Doherty configuration, specifically, the peaking transistor IC(s) may be larger than the carrier transistor IC(s) by some multiplier. For example, the peaking transistor IC(s) may be twice the size of the carrier transistor IC(s) such that the peaking transistor IC(s) have approximately twice the current carrying capability of the carrier transistor IC(s). Peaking-to-carrier amplifier IC size ratios other than a 2:1 ratio may be implemented, as well.

For convenience of explanation, and to reflect the fact that FETs are predominately utilized in the production of PA devices at present, the foregoing paragraph and this document, as a whole, principally focus on implementations of the (e.g., Doherty) PA devices implemented utilizing FETs. It is emphasized, however, that alternative embodiments of the present disclosure can be implemented utilizing other transistor technology including, but not limited to, bipolar transistors. Accordingly, in embodiments of the Doherty PA circuit 30 shown in FIG. 1, and in embodiments of all other PA devices described herein, any and all amplifier stages can be implemented utilizing any suitable transistor technology, such as FETs, bipolar transistors, or a combination thereof.

The carrier amplifier 50 of the Doherty PA circuit 30 may be biased to function in class AB mode during circuit operation, while the peaking amplifier 52 is biased to function in class C mode. At low power levels (e.g., when the power of the input signal at the node 32 is less than the turn-on threshold level of the peaking amplifier 52), the Doherty PA circuit 30 operates in a low-power or back-off mode. In the low-power (back-off) mode, the carrier amplifier 50 is typically the only amplifier supplying current to the load 44. When the power of the input signal exceeds a threshold level of the peaking amplifier 52, however, the Doherty PA circuit 30 transitions to operation in a high-power mode in which the carrier amplifier 50 and the peaking amplifier 52 supply current to the load 44 concurrently. At this point, the peaking amplifier 52 provides active load modulation at combining node 42, thereby allowing a continued, linear increase in the current of the carrier amplifier 50.

In embodiments of the Doherty PA circuit 30, input and/or output impedance matching networks 54, 56 (input MNm, output MNm) may be implemented at the input and/or at the output of the carrier amplifier 50, Similarly, input and/or output impedance matching networks 58, 60 (input MNp, output MNp) may be implemented at the input and/or at the output of the peaking amplifier 52, In each case, the matching networks 54, 56, 58, 60 may serve to incrementally increase the circuit impedance toward the load impedance and source impedance. In certain implementations, all or portions of the input and output impedance matching networks 54, 56, 58, 60 may be implemented inside a power transistor device (package or module) including the carrier and/or peaking amplifiers 50, 52, as indicated in FIG. 1 by the dashed box representative of the Doherty PA device 28. In other instances, the input and output impedance matching networks 54, 56, 58, 60 may be wholly or partially implemented outside of the Doherty PA device 28, such as on a printed circuit board (PCB) or another substrate to which the Doherty PA device 28 is mounted.

In the generalized example of FIG. 1, the Doherty PA circuit 30 has a standard load network configuration. Accordingly, the input-side circuit portion is configured such that an input signal supplied to the peaking amplifier 52 is delayed by 90 degrees with respect to the input signal supplied to the carrier amplifier 50 at the center frequency of operation of, for example, the Doherty PA circuit 30. To ensure arrival of the carrier and peaking input RF signals at the amplifiers 50, 52 with approximately 90 degrees of phase shift, a phase delay element 62 may be incorporated into the Doherty PA circuit 30 to provide about 90 degrees of phase delay to the peaking input signal. For example, the phase delay element 62 may include a quarter wave transmission line, or another suitable type of delay element, with an electrical length of about 90 degrees. To compensate for the resulting 90 degree phase delay difference between the carrier and peaking amplification paths 38, 40 at the inputs of the amplifiers 50, 52, and thereby ensure that the amplified signals arrive in phase at the combining node 42, the output-side circuit portion is configured to apply about a 90 degree phase delay to the signal between the output of carrier amplifier 50 and the combining node 42. This may be achieved through the provision of an additional delay element 64, which may or may not be contained in the Doherty PA device 28 itself.

While the Doherty PA circuit 30 has a standard load network configuration in the illustrated embodiment, other load network configurations are possible in other implementations. For example, in alternative implementations, the Doherty PA circuit 30 may instead have an alternate "inverted") load network configuration. In this case, the input-side circuit portion may be configured such that an input signal supplied to the carrier amplifier 50 is delayed by about 90 degrees with respect to the input signal supplied to the peaking amplifier 52 at the center frequency of operation of the Doherty PA circuit 30. Correspondingly, the output-side circuit portion may be configured to apply about a 90 degree phase delay to the signal between the output of peaking amplifier 52 and the combining node 42.

In various implementations, the power amplifiers 50, 52 may each include a single-stage or multi-stage power transistor die(s) bonded to a substrate. Further, as noted above, the power amplifiers 50, 52, as well as portions of the impedance matching networks 54, 56, 58, 60, may be implemented in the form of the Doherty PA device 28. The input and output matching networks 54, 56, 58, 60, or portions thereof, may be implemented as additional components within the PA device 28, and/or as circuitry integrated within the power transistor die(s). Either or both of the power amplifiers 50, 52 may be implemented with multiple parallel amplification paths (rather than with a single amplification path) in more complex embodiments. For example, in an example asymmetric Doherty configuration, the carrier amplifier 50 may be implemented with two (or a greater number of) parallel amplification paths, while the peaking amplifier 52 is implemented with three (or some other number of) parallel amplification paths. Further, in the case of an N-way Doherty amplifier (N>2), the Doherty PA device 28 may contain multiple peaking amplifiers of differing configurations or levels. Further discussion in this regard will now be provided in conjunction with FIG. 2.

Figure 2:
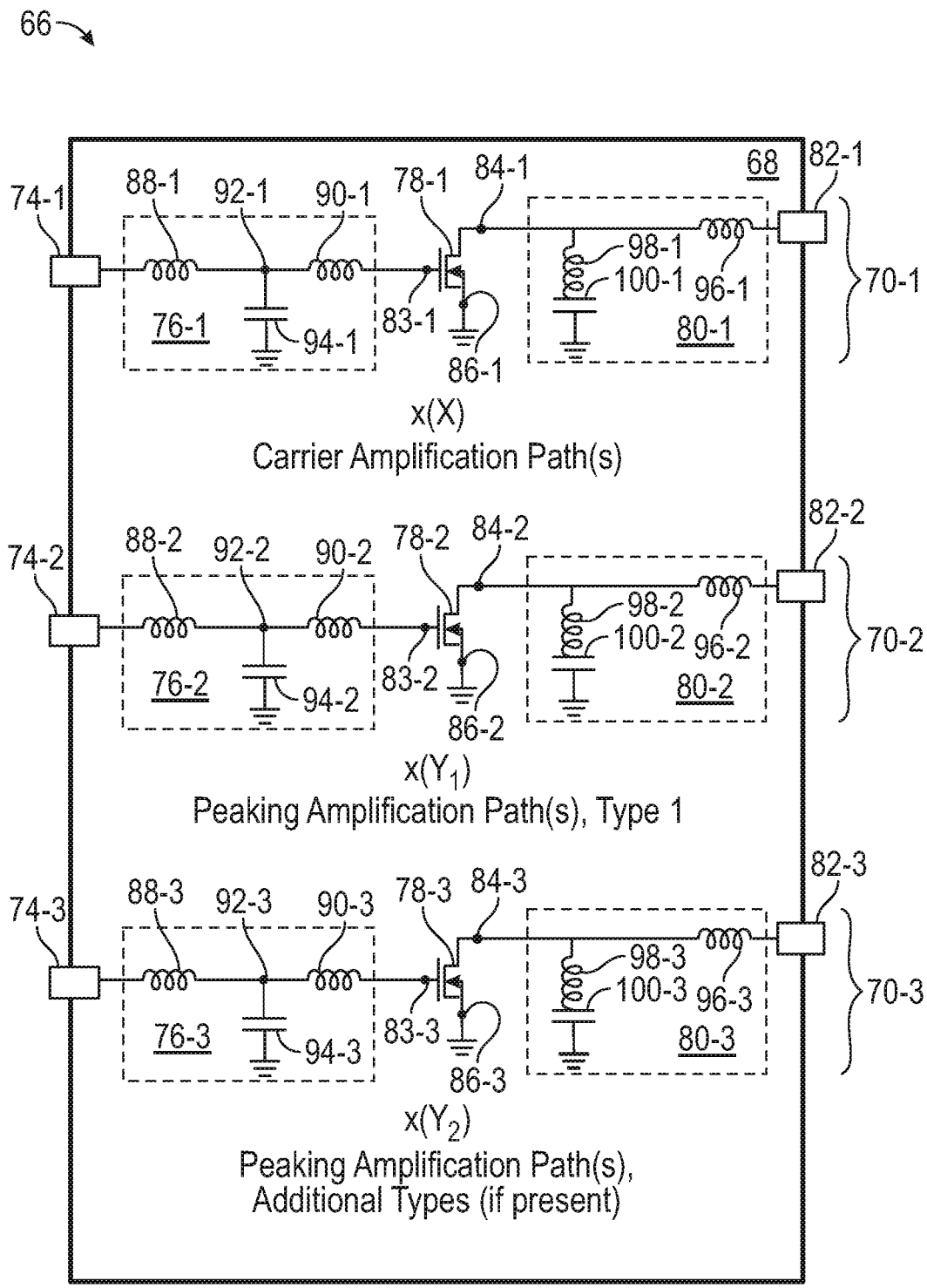
FIG. 2 is a circuit diagram of parallel signal amplification paths suitably included in a two-way or N-way Doherty PA package (N>2), as illustrated in accordance with an example embodiment.

Turning to FIG. 2, there is shown a schematic diagram of an example Doherty PA device (specifically, a Doherty PA package 66) including a package body 68 through which multiple electrically-conductive signal amplification paths 70-1, 70-2, 70-3 extend. At least two types of signal amplification paths are provided through the Doherty PA package 66: one or more carrier (main) signal amplification paths 70-1, and one or more peaking (auxiliary) signal amplification paths 70-2, 70-3. When the Doherty PA package 66 assumes the form of an N-way Doherty amplifier (N>2), the Doherty PA package 66 may contain two or more different types of peaking signal amplification paths 70-2, 70-3, often referred to as different peaking signal amplification levels. In such instances, and as schematically indicated in FIG. 2, the N-way Doherty PA package 66 may contain:(i) a first type (or level) of peaking signal amplification path, which may include one or more individual signal amplification path(s) 70-2 extending through the Doherty PA package 66, and (ii) one or more additional types (or levels) of peaking signal amplification paths, again including any desired number of signal amplification paths 70-3. The peaking signal amplification paths 70-2, 70-3 may be routed through different transistors, phase-shifted, and otherwise processed differently to produce a N-way (e.g., a 3- or 4-way) Doherty amplifier. In other instances, the Doherty PA package 66 may assume the form of a two-way Doherty amplifier, and the peaking amplifications path(s) 70-3 may be omitted.

The Doherty PA package 66 can include any practical number of carrier signal amplification paths 70-1 (designated as "X") extending in parallel through the package 66. When the Doherty PA package 66 includes two or more carrier signal amplification paths 70-1, the illustrated circuit structure may repeat for each instance of the carrier signal amplification path 70-1, Similarly, the Doherty PA package 66 can include any practical number of carrier signal amplification paths 70-2, 70-3 of a first (and possibly only) type or level. This may be expressed by stating that the Doherty PA package 66 includes "$Y_1$" number of peaking signal amplification paths 70-2 of the first type. If the Doherty PA package 66 includes one or more peaking signal amplification paths 70-3 of additional (second and possibly third) types, it may further be stated that the Doherty PA package includes "$Y_2$" number of peaking signal amplification paths 70-3 for each additional signal amplification path type. When the Doherty PA package 66 assumes the form of an N-way Doherty amplifier containing two or more peaking signal amplification path types, the number of signal amplification paths of each type may be equal such that $Y_1=Y_2$. Further, when the N-way Doherty amplifier has a symmetric layout, the number of carrier signal amplification paths may be selected such that $X=Y_1=Y_2$. Conversely, when the N-way Doherty amplifier has an asymmetric layout, the number of carrier signal amplification paths may be selected such $X<Y_1=Y_2$. In still further instances wherein the Doherty PA package 66 has a two-way Doherty amplifier topology, the PA package 66 may lack additional peaking signal amplification paths 70-3, while $Y_1$ may be equal to X (in the case of a symmetric Doherty circuit structure) or greater than X (in the case of an asymmetric Doherty circuit structure).

The circuit structure for each of the signal amplification paths 70-1, 70-2, 70-3 may be generally similar, as schematically indicated in FIG. 2, The following description thus applies equally to each amplification path 70-1, 70-2, 70-3, with common reference numerals utilized to denote like elements. The previously-introduced numbering scheme is continued below such that the suffix "-1" is appended to reference numerals identifying circuit elements located in carrier signal amplification path(s) 70-1, while the suffix "-2" is appended to reference numerals identifying circuit elements located in peaking signal amplification path(s) 70-2. Similarly, the suffix "-3" is appended to reference numerals identifying circuit elements located in any peaking signal amplification path(s) 70-3 of additional types or levels, if included in the Doherty PA package 66.

Also, in the following description, the aforementioned suffixes are omitted when generally referring to the same type of circuit element (or other feature) common across all amplification paths 70-1, 70-2, 70-3.

Each signal amplification path of the example Doherty PA package 66 includes a package input 74 (e.g., a first electrically-conductive package terminal or lead of the package 66), an input impedance matching circuit 76, at least one power transistor 78, an output impedance matching circuit 80, and a corresponding package output 82 (e.g., a second electrically-conductive package terminal or lead of the package 66). Addressing first the power transistor 78, the transistor 78 may be the primary active component of each amplification path. Each transistor 78 includes a control terminal 83 and two current-conducting terminals 84, 86. The current-conducting terminals 84, 86 of the transistor 78 are spatially and electrically separated by a variable-conductivity channel. For example, in embodiments, each transistor 78 may be a FET including a gate (control terminal 83), a drain (a first current-conducting terminal 84), and a source (a second current-conducting terminal 86). In various implementations, and utilizing nomenclature typically applied to FETs in a non-limiting manner, the gate of transistor 78 is coupled to the input impedance matching circuit 76, the drain of transistor 78 is coupled to the output impedance matching circuit 80, and the source 86 of transistor 78 is coupled to ground (or another voltage reference). Through the variation of control signals provided to the gate of transistor 78, then, the current between the current-conducting terminals of transistor 78 may be modulated, as appropriate, during operation of the Doherty PA package 66.

The input impedance matching circuit 76 is coupled between the corresponding package input 74 and the control terminal 83 (e.g., the gate) of the transistor 78. The input impedance matching circuit 76 is configured to raise the impedance of the Doherty PA package 66 to a higher impedance level; e.g., in a range from about 2 to about 10 Ohms or higher. This may enable a PBC-level matching interface from a non-illustrated driver stage to have an impedance achieved in high-volume manufacturing with minimal loss and variation. As indicated in FIG. 2, each input impedance matching circuit 76 may have a T-match configuration. Accordingly, the input impedance matching circuit 76 may contain two inductive elements 88, 90, such as two bond wire or wirebond arrays, and a shunt capacitance 94. The first inductive element 88 is electrically coupled between the corresponding package input 74 and a node 92, which is coupled to a first terminal of the capacitor 94, The second inductive element is coupled between the node 92 (or the first terminal of the capacitor 94) and the control terminal 83 of the transistor 78. Finally, the second terminal of the capacitor 94 may be electrically coupled to a reference voltage, such as ground.

Due to the above-described circuit arrangement, the inductive elements 88, 90 and shunt capacitance 94 collectively form a low-pass filter upstream of the transistor 78, The inductance values of the inductive elements 88, 90 and the value of the capacitance 94 will vary among embodiments. However, by way of example, the series combination of the inductive elements 88, 90 may have an inductance value in a range between about 50 picohenries (pH) to about 3 nanohenries (nH), while the shunt capacitance 94 may have a capacitance value in a range between about 5 picofarads (pF) to about 120 pF in embodiments. Comparatively, the shunt capacitance 94 may be selected to have a relatively large capacitance, such as a capacitance exceeding about 60 pF, to provide an acceptable RF low-impedance point. In other instances, the inductance value of the inductive elements 88, 90 and/or the capacitance of the shunt capacitance 94 may be greater or less than the aforementioned ranges. Further, other embodiments may include input impedance matching circuits 76 that have other circuit topologies and/or that form other types of filters.

Discussing the output-side of the Doherty PA package 66, the output impedance matching circuit 80 is coupled between the first current-conducting terminal 84 (e.g., the drain) of the transistor 78 and the corresponding package output 80. The output impedance matching circuit 80 is configured to match the output impedance of the Doherty PA package 66 with the input impedance of an external circuit or component (not shown) electrically coupled to the output 80. In embodiments, the output impedance matching circuit 80 includes at least two inductive elements 96, 98 and a shunt capacitance 100. An inductive element 96 (e.g., a third wirebond array) is coupled between the first current-conducting terminal 84 (e.g., drain) of the transistor 78 and the package output 80. A further inductive element 98 (e.g., a fourth wirebond array) is electrically coupled between the first current-conducting terminal 84 of transistor 78 and a first terminal of shunt capacitance 100, A second terminal of the shunt capacitance 100 is coupled to ground, or to another voltage reference, in the illustrated embodiment. The shunt inductive element 98 and the shunt capacitance 100 are therefore electrically coupled in series between the current-conducting terminal 84 of transistor 78 and ground. This combination of impedance matching elements functions as a first (high-pass) matching stage. By way of example, the shunt inductive element 98 may have an inductance value in a range between about 66 pH to about 3 nH. Comparatively, the shunt capacitance 100 may have a capacitance value in a range between about 30 pF to about 500 pF. These values may fall outside of the foregoing ranges in further embodiments. Further, other embodiments may include output impedance matching circuits 80 that have other circuit topologies and/or that form other types of filters.

In various implementations, portions of the input and output impedance matching circuits 76, 80 may be implemented as distinct or discrete components, or possibly as portions of other assemblies, such as a PCB, an integrated passive device (IPD), or a low-temperature co-fired ceramic (LTCC) device. In other implementations, portions of the input and/or output impedance matching circuits 76, 80 may be coupled to and/or integrated within the semiconductor die or dies carrying the transistors 78. Some or all of the signal amplification paths 70 also may include non-illustrated bias circuitry in certain embodiments. When present, such bias circuity may be electrically connected through one or more bias leads to an external bias circuit (not shown). Alternatively, the external bias circuits may be instead connected to the package input 74 or to the package output 80, and the bias voltage(s) may be provided through the input 74 and/or the output 80, as appropriate.

There has thus been provided a general discussion of Doherty PA devices containing peaking and carrier transistor dies. In accordance with embodiments of the present disclosure, the Doherty PA devices described above are beneficially fabricated to contain at least one peaking die having an inverted orientation and certain other structural features enabling inversion of the peaking die, as described below. For example, referring briefly once again to FIG. 2, the semiconductor die on which the peaking transistor 78-2 is formed and/or the semiconductor die on which the peaking transistor 78-3 is formed (if included in the Doherty PA package 66 and formed on a separate die) may be beneficially imparted with an inverted orientation in many instances for reasons explained below. Comparatively, the semiconductor die bearing the carrier transistor 78-1 will often have a non-inverted or standard configuration, although this need not be the case is all instances as further discussed below in connection with FIG. 11. An example of one manner in which a PA device can be fabricated to include one or more inverted peaking die will now be provided in conjunction with FIGS. 3-10, While described below in the context of a particular type of PA device (a two-way, dual path, symmetric Doherty PA package), the following description is equally applicable to any type of PA device into which one or more inverted peaking dies are usefully incorporated.

Example of a Doherty PA Package Containing an Inverted Peaking Die

Figure 3:
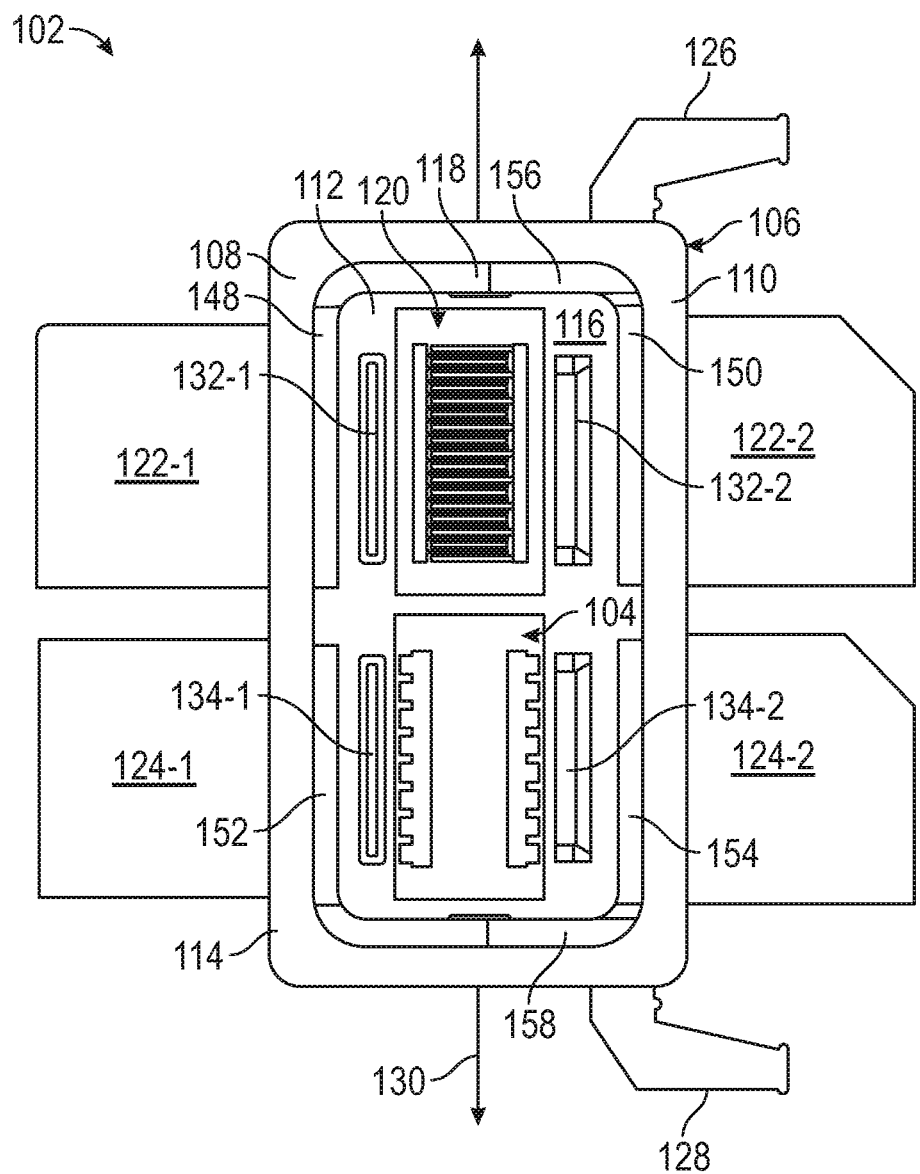
FIGS. 3 and 4 are top-down views of a symmetric, two-way, dual path Doherty PA package containing an inverted peaking die, as illustrated at different stages of manufacture and depicted in accordance with an example embodiment of the present disclosure.

Referring now to FIG. 3, a Doherty PA package 102 containing an inverted peaking die 104 is shown in a partially-completed state, as illustrated in accordance with an example embodiment of the present disclosure. Here, the Doherty PA package 102 assumes the form an air cavity package to which a cover piece or lid is attached to complete package fabrication following wire bond formation, as discussed below in connection with FIGS. 4 and 5. The present example notwithstanding, the following description is equally applicable to any and all microelectronic package types amenable to usage in the fabrication of Doherty PA packages and PA packages, generally, including encapsulated or over-molded packages lacking gas-containing internal cavities. As shown in FIG. 3, the example Doherty PA package 102 includes a package body 106 having a first longitudinal edge portion or package side 108 and a second, opposing longitudinal edge portion or package side 110, with multiple leads extending from the package sides 108, 110 in opposing directions. In embodiments, the package leads extending from the package side 108 serve as signal input leads, while the leads extending from the package side 110 serve as signal output leads. For this reason, the package sides 108, 110 are also referred to below as the "input side 108" and the "output side 110" of the Doherty PA package 102, respectively.

The package body 106 of the Doherty PA package 102 can assume various structural forms without limitation. In the illustrated embodiment, the package body 106 includes an electrically-conductive substrate or base flange 112 over which package sidewalls 114 extend, Specifically, the package sidewalls 114 extend around an outer portion of the upper surface of the base flange 112 to enclose or bound an outer periphery of an air cavity 116. An inner peripheral ledge or bond pad shelf 118 also provided within the air cavity 116 and may be integrally formed with the package sidewalls 114 in certain implementations. The package sidewalls 114 are composed of a dielectric material, such as a polymeric material or a ceramic, to provide electrical isolation between the below-described package leads and the electrically-conductive base flange 112. In embodiments, the package sidewalls 114 may be provided as one or more discretely-fabricated structures, such as a single piece or multi-piece window frame, positioned over the base flange 112 and bonded in the desired position(s). In other instances, the package sidewalls 114 may be molded over and around the base flange 112 utilizing, for example, an insert molding process. In this latter case, the package sidewalls 114 may or may not extend downwardly beyond the frontside of the base flange 112 to form a lower skirt region. When present, such a skirt region may extend around the outer periphery of the base flange 112, while a lower principal surface of the flange 11.2 remains exposed along the backside or bottommost surface of the package body 106.

As indicated above, the Doherty PA package 102 is imparted with a symmetric, two-way, dual path amplifier design in the illustrated embodiment. Accordingly, the Doherty PA package 102 includes two signal input leads 122-1, 124-1, which project from the input side 108 of the package body 106; and two signal output leads 122-2, 124-2, which project from the output side 110 of the package body 106 in a direction opposite leads 122-1, 124-1. In this particular example, the package leads 122-1, 122-2 serve as carrier signal input and output leads, respectively; and are thus jointly referred to below as the "carrier leads 122" or the "carrier lead pair 122," Comparatively, the leads 124-1, 124-2 serve as peaking signal input and output leads, respectively; and are jointly referred to below as the "peaking leads 124" or the "peaking lead pair 124," In other embodiments, the Doherty PA package 102 may include a greater number of leads; e.g., as may be the case when the Doherty PA package 102 assumes the form of an N-way Doherty PA (N>2) or when the Doherty PA package 102 contains additional signal-carrying paths therethrough. In such embodiments, the package leads 122, 124 may have varying dimensions and shapes, noting that the Doherty PA package 102 can be produced as various other packages types (e.g., as a gullwing or leadless package) in alternative implementations. The Doherty PA package 102 also includes two bias leads 126, 128 (e.g., drain bias leads) to provide electrical connection to bias circuity formed on the below-described semiconductor dies or otherwise contained within the Doherty PA package 102. The bias leads 126, 128 may be omitted in other embodiments of the Doherty PA package 102, or more than two bias leads may be implemented (e.g., both gate and drain bias leads).

With continued reference to FIG. 3, the electrically-conductive base flange 112 of the Doherty PA package 102 has an upper principal surface or frontside 164 (identified in FIG. 6) to which the inverted peaking die 104 and a non-inverted carrier die 120 are attached. The packaged die 104, 120 are disposed in a side-by-side or adjacent relationship, as taken along the longitudinal axis of the Doherty PA package 102 (represented by double-headed arrow 130 in FIG. 3). The non-inverted carrier die 120 may be mounted to the base flange 112 at a position laterally aligned with the carrier input lead 122-1 and the carrier output lead 122-2; that is, at a position aligned along an axis parallel to the frontside or upper surface of the base flange 112 and perpendicular to the longitudinal axis 130 of the package 102. Similarly, the inverted peaking die 104 may be mounted to the base flange 112 at a position laterally aligned with the peaking input lead 124-1 and the peaking output lead 124-2. This positioning facilitates interconnection of the dies 104, 120 with their corresponding lead pairs 122, 124, as discussed below in connection with FIG. 4.

The base flange 112 of the Doherty PA package 102 can be realized as a body of material, a layered or laminated structure, or other substrate suitable for supporting the packaged die 104, 120. Additionally, the base flange 112 may serve as a heatsink and/or an electrically-conductive terminal of the Doherty PA package 102. By way of example, the base flange 112 may assume the form of a monolithic metallic structure, plate, or slug in certain implementations. In other implementations, the base flange 112 may have a multilayer metallic construction; e.g., the base flange 112 may contain multiple thermally-conductive layers, which are bonded in a stacked or laminated arrangement Often, the base flange 112 will be composed predominately of one or more metals having relatively high thermal conductivies, such as copper (Cu). As a more specific example, in an embodiment wherein the base flange 112 is a layered or laminated structure, the base flange 112 may include at least one Cu layer combined with at least one disparate metal layer having a Coefficient of Thermal Expansion (CTE) less than that of the Cu layer. The disparate metal layer may be composed of, for example, Molybdenum (Mo), a Mo—Cu alloy, or a Mo—Cu composite material. In this manner, base flange 112 may be imparted with both a relatively high thermal conductivity and a lower effective CTE.

The Doherty PA package 102 may be fabricated to include one or more IPDs in embodiments. In the illustrated example, specifically, the Doherty PA package 102 contains four IPDs located within the package body 106: two input-side IPDs 132-1, 134-1 and two output-side IPDs 132-2, 134-2. The input-side IPDs 132-1, 1344 align with the output-side IPDs 132-2, 134-2 to form two IPD pairs 132, 134. The IPDs within the IPD pairs 132, 134 are spaced along axes parallel to the longitudinal axis 130 of the Doherty PA package 102 and laterally align with the lead pairs 122, 124, respectively. In various embodiments, the IPDs in IPD pairs 132, 134 assume the form of integrated capacitors, each of which include a first terminal that is electrically connected to a top-side bond pad of the IPD, and a second terminal that is coupled to electrical ground through the base flange 112 when the Doherty PA package 102 is installed within a larger system or device. The IPD 1324 may thus correspond to the input-side capacitor 94-1 of the Doherty PA package 66 shown in FIG. 2, while the IPD 134-1 corresponds to the input-side capacitor 94-2 of the package 66. Similarly, the IPD 132-2 may correspond to the output-side capacitor 100-1 of the Doherty PA package 66 shown in FIG. 2, while the IPD 134-2 corresponds to the input-side capacitor 100-2 of the package 66. In other instances, one or more of the IPDs:132, 134 may be omitted from the Doherty PA package 102; or may be replaced by discrete passive devices, such as chip caps or other Surface Mount Devices (SMDs), LTCC structures, or small PCBs that include the above-described input-side and output-side capacitors.

Figure 4:
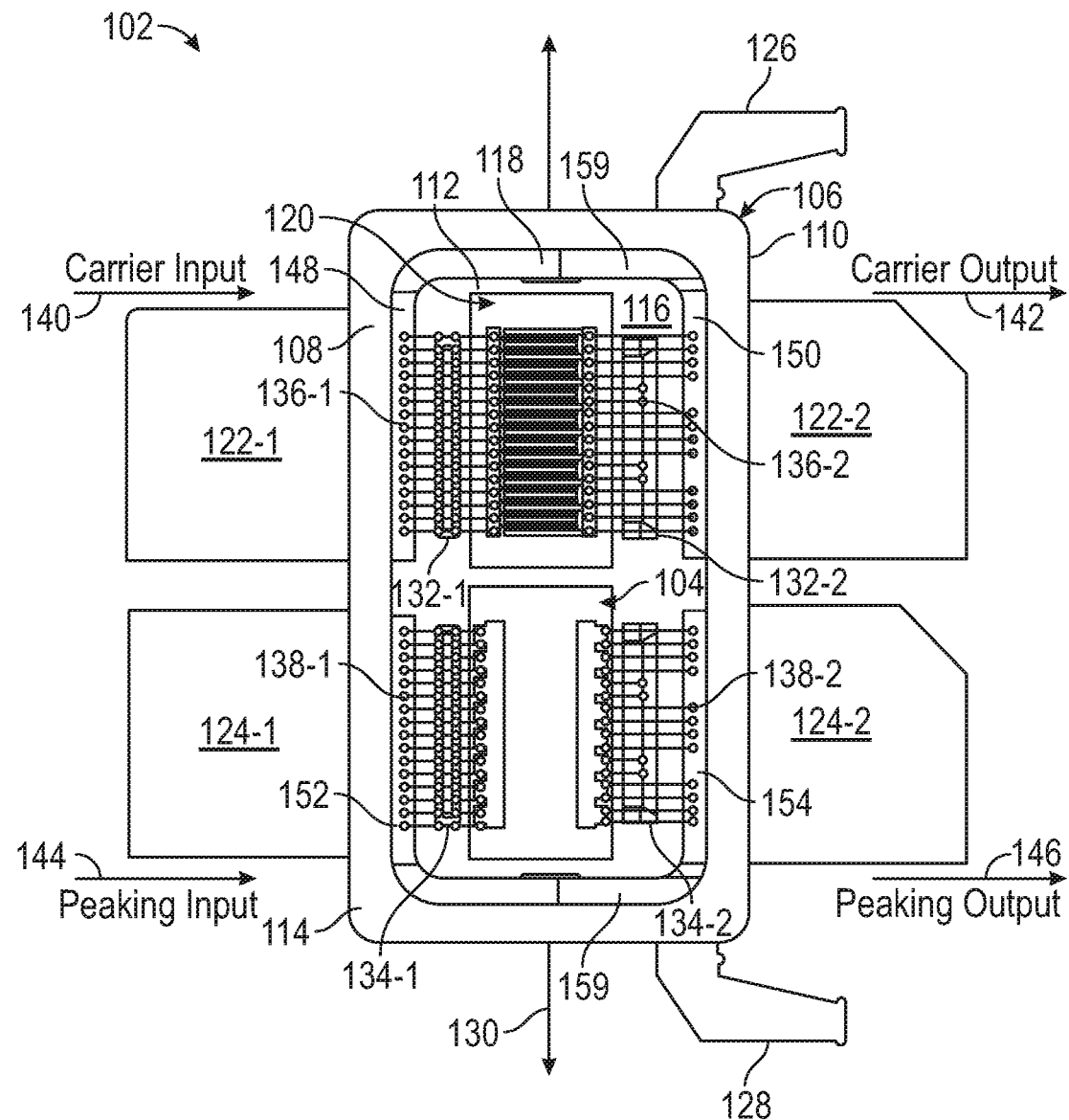

Progressing to FIG. 4, the Doherty PA package 102 is shown following electrical interconnection to complete the desired internal wiring structure of the package. In this example, bond wire formation or "wirebonding" is utilized to form the desired electrical interconnections; however, in other instances, another interconnection technique (e.g., the formation of three-dimensionally printed traces) can be utilized as an alternative to, or in combination with, wirebonding to form the desired electrical interconnections. Pursuant to wirebonding, multiple input-side wirebond arrays 136-1, 138-1 and multiple output-side wirebond arrays 136-2, 138-2 are produced to electrically interconnect the transistor dies 104, 120; the IPDs 132, 134; and the lead pairs 122, 124 and thereby complete the signal-carrying paths through the Doherty PA package 102, as represented by arrows 140, 142, 144, 146, Each input path thus includes two wirebond bond arrays, and each output path likewise includes wirebond arrays. Here, the arrows 140, 142 represent the carrier signal amplification path, which extends from the carrier input lead 122-1; through the input-side wirebond arrays 136-1, the input-side IPD 132-1, the carrier die 120, the output-side wirebond arrays 136-2, and the output-side 1PD 132-2; and to the carrier output lead 122-2.

Comparatively, the arrows 144, 146 represent the peaking signal amplification path, which extends from the peaking input lead 124-1; through the input-side wirebond arrays 138-1, the input-side IPD 134-1, the peaking die 104, the output-side wirebond arrays 138-2, and the output-side IPD 134-2; and to the peaking output lead 124-2.

Selected wirebonds in the input-side wirebond array 136-1 are formed between an inner edge 148 of the carrier signal input lead 122-1, which is exposed within the package body 106 along the bond pad shelf 118, and the input-side IPD 132-1, Additional wirebonds are formed between the IPD 132-1 and a first bond pad structure provided along a frontside edge of the carrier die 120, Similarly, selected wirebonds in the output-side wirebond array 136-2 extend from a second bond pad structure provided on the carrier die 120 to the output-side IPD 132-2. Other wirebonds extend from the carrier die 120 to an inner edge 150 of the carrier signal output lead 122-2 exposed along the bond pad shelf 118 to complete the carrier signal amplification path 140, 142 (FIG. 4). Similar connections are formed between an inner exposed edge 152 of the peaking input lead 124-1, the IPD 134-1, and a bond pad structure provided on the inverted peaking die 104 by the wirebond array 138-1; and between an inner exposed edge 154 of the peaking output lead 124-2, the 1PD 134-2, and another bond pad structure provided on the inverted peaking die 104 by the wirebond array 138-2. Finally, although not shown in FIG. 4 for clarity, certain bond pads (or portions of the bond pad structures) on the illustrated PA dies 104, 120 (or perhaps other bias circuitry) are further wirebonded to exposed inner edges 159 of the bias leads 126, 128.

Briefly addressing FIGS. 2 and 4 in combination, the wirebond arrays 136 (FIG. 4) provide the inductances corresponding to the symbols 88-1, 90-1, 96-1, 98-1 (FIG. 2) during operation of the Doherty PA package 102. Accordingly, the combination of the lead pairs 122, the wirebond arrays 136, the IPDs 132, and the carrier transistor(s) provided on the carrier die 120 form one instance of the circuit structure corresponding to the carrier signal amplification path 70-1 in FIG. 2. Similarly, the wirebond arrays 138 provide the inductances represented by the symbols 88-2, 90-2, 96-2, 98-2 in FIG. 2. The combination of the lead pairs 124, the wirebond arrays 138, the IPDs 134, and the peaking transistor(s) provided on the peaking die 104 thus form one instance of the circuit structure corresponding to the peaking amplification path 70-2 in FIG. 2. As the Doherty PA package 102 is imparted with a two-way configuration in the illustrated example, circuitry forming one or more additional types of peaking amplification paths (corresponding to the peaking amplification path(s) 70-3 in FIG. 2) is not included in the package 102 in this particular instance, but may be included in further embodiments of the Doherty PA package 102.

Figure 5:
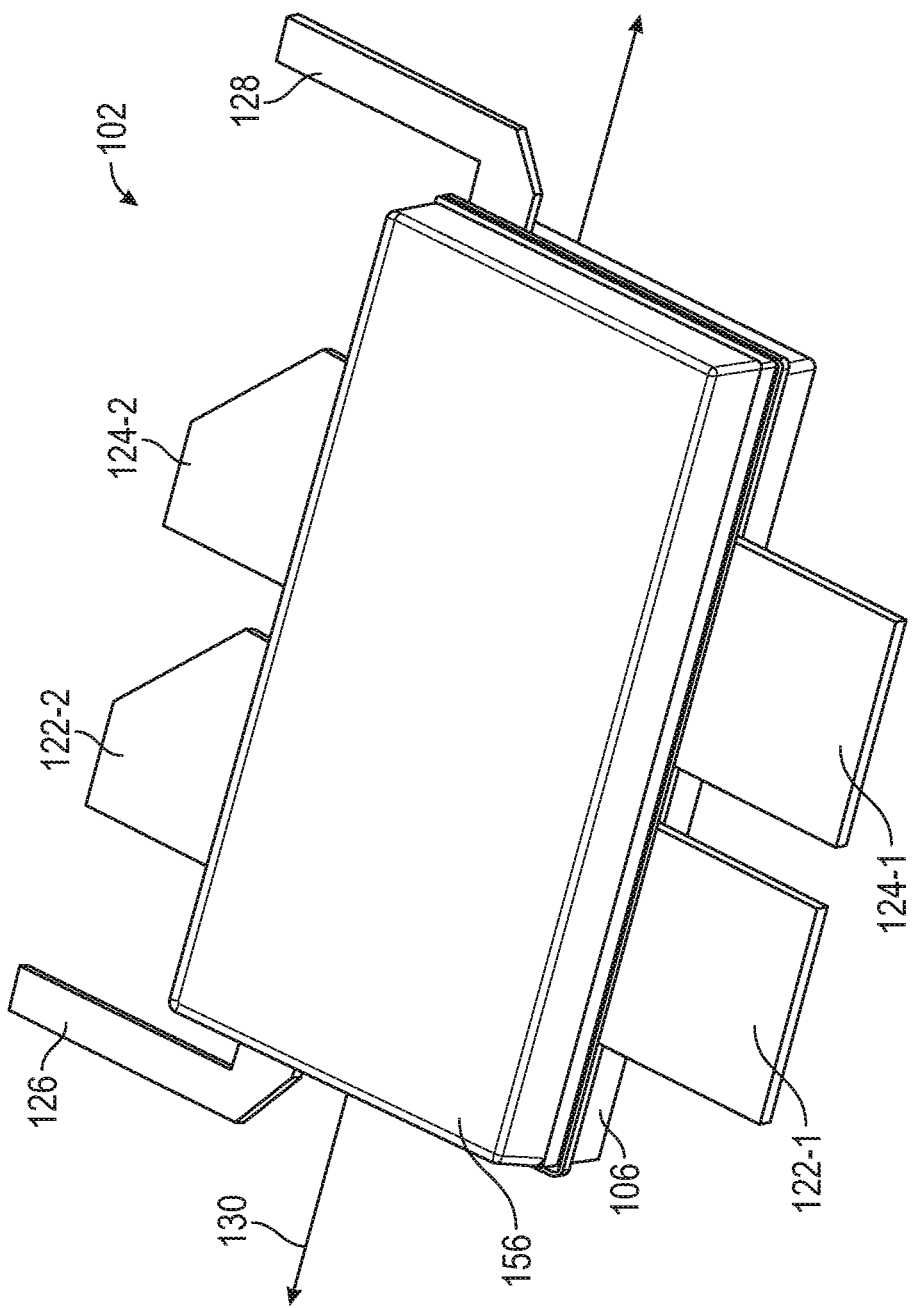
FIG. 5 is an isometric view of the example Doherty PA package shown in FIGS. 3 and 4, as illustrated in a completed state following lid attachment.

Addressing next FIG. 5, a lid or cover piece 156 is attached to the upper peripheral edge of the package sidewall 114 after wirebond formation. Attachment of the cover piece 156 encloses the transistor dies 104, 1.20; the wirebond arrays 136, 138; and the other internal features of the Doherty PA package 102 within the newly-sealed air cavity 116. Lid attachment may be performed under pressure, temperature, and atmospheric conditions and utilizing a bonding material (e.g., a sintered material, an epoxy, or a die attachment material) appropriate to capture a desired pressure and atmosphere within the air cavity package. Lid attachment completes fabrication of the Doherty PA package 102 to yield the final package, as shown in FIG. 5, with testing suitably performed prior to and/or after lid attachment. Now complete, the Doherty PA package 102 features the inverted peaking die 104 and certain other associated structural features, which enable a reduction in the overall size of the peaking die 104 and, therefore, a reduction in the overall cost of Doherty PA package 102 with little to no appreciable detriment in performance of the peaking transistor IC. Other benefits are also achieved due to the inversion of the peaking die 104 and the inclusion of associated features within the package 102, as discussed more fully below. The inverted peaking die 104, and one manner in which the inverted peaking die 104 may be integrated into the example Doherty PA package 102, will now be described in detail in connection with FIGS. 6-10.

Figure 6:
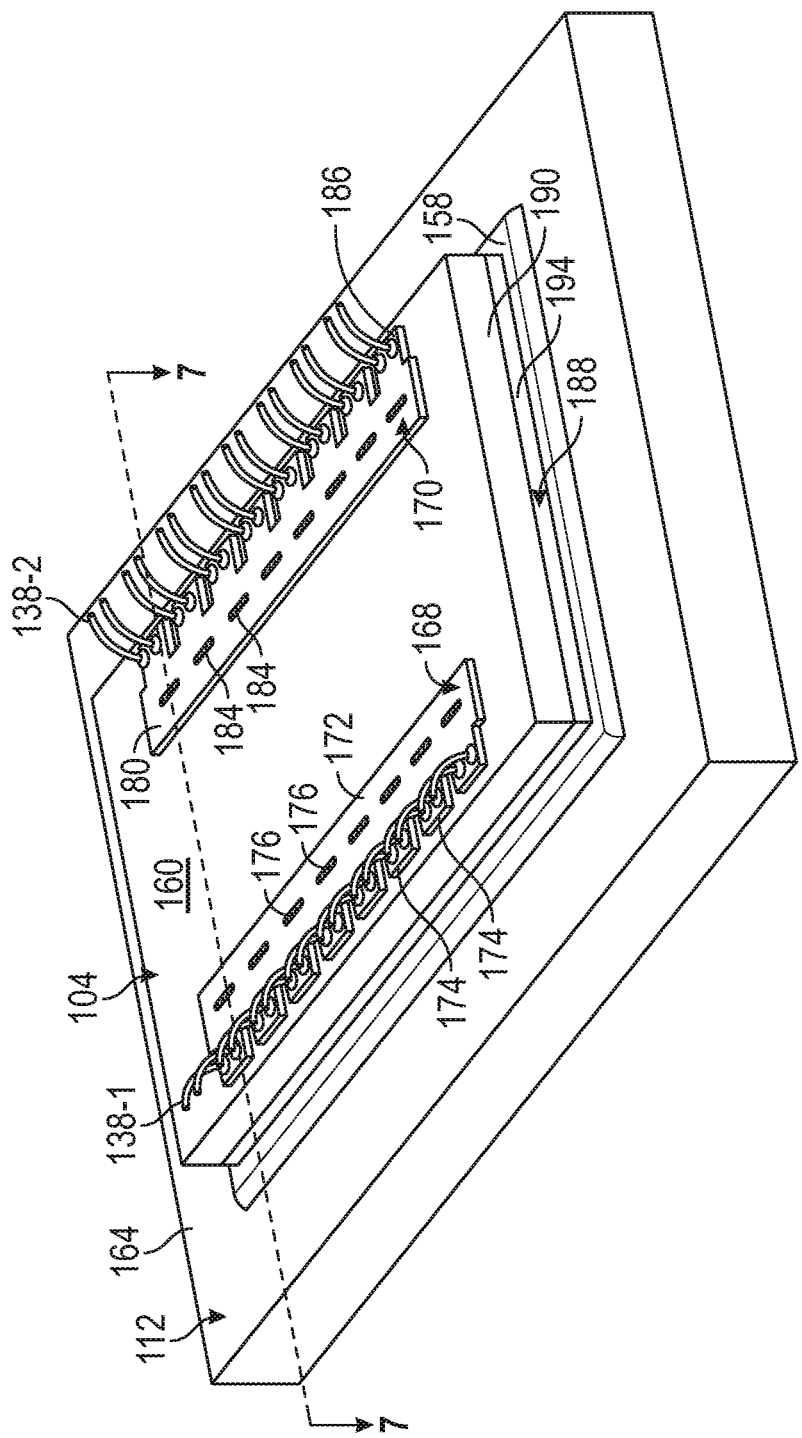
FIG. 6 is an isometric view of the backside of the inverted peaking die, the base flange (shown in cutaway), an electrically-conductive bond layer, and two wirebond arrays (partially shown) suitably contained in the example Doherty PA package shown in FIGS. 3-5.
Figure 7:
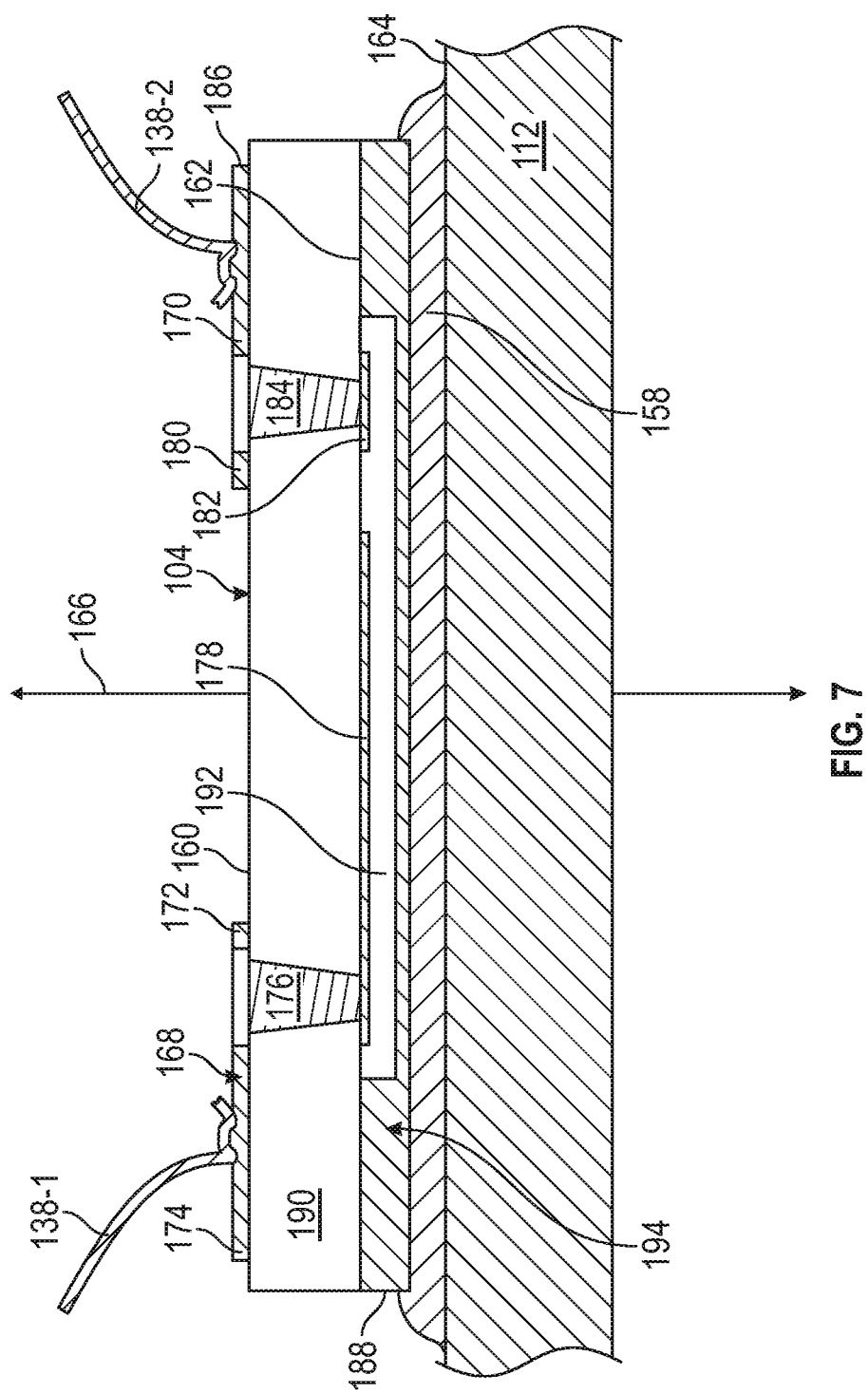
FIG. 7 is a cross-sectional view of the inverted peaking die, the electrically-conductive bond layer, the base flange, and certain wirebonds, as taken along section plane 7-7 identified in FIG. 6.

FIGS. 6 and 7 are detailed isometric and cross-sectional views, respectively, of the inverted peaking die 104, the base flange 112 (partially shown), and an electrically-conductive bond layer 158. In this view, it can be seen that the inverted peaking die 104 is attached to the base flange 112 through the electrically-conductive bond layer 158, which contacts and bonds the frontside of the peaking die 104 to the frontside or upper surface of the flange 112. The following description will discuss the inverted peaking die 104 as including a die body 190 having a first principal surface 160 and a second, opposing principal surface 162. This terminology is utilized to distinguish the body 190 of the peaking die 104 (i.e., the substrate portion of the die 104) from the below-described backmetal layers and frontside layer system formed thereover. A peaking transistor IC, such as a power FET corresponding to the transistor 78-2 in FIG. 2, is formed at and below the surface 162 of the die body 190. Accordingly, this surface 162 is referred to as the "active side" or the "frontside 162" of the die body 190 hereafter. Conversely, the opposing surface 160 is referred to as the "passive side" or the "die backside 160" hereafter. Due to the inverted orientation of the peaking die 104, the die frontside 162 faces the upper principal surface 164 of the electrically-conductive base flange 112, The die frontside 162 is therefore located closer to the base flange 112 than is the backside 160 of the die body 190, as taken along an axis orthogonal to the frontside 162 (represented by double-headed arrow 166 in FIG. 7 and referred to hereafter as the "die centerline 166"). Conversely, the backside 160 of the die body 190 faces away from the upper principal surface 164 of the base flange 112 and is located further from the base flange 112 than is the die frontside 162.

A first backside (gate) bond pad structure:168 and a second backside (drain) bond pad structure 170 are formed on the backside 160 of the body 190 of the inverted peaking die 104. The gate bond pad structure 168 includes an elongated body portion or "backside gate manifold" 172, as well as a number of bond pad extensions 174 (a few of which are labeled for clarity) projecting from a side of the backside gate manifold 172 toward an outer edge of the inverted peaking die 104. Several TSVs 176 are formed through the body 190 of the inverted peaking die 104 at selected locations underlying the backside gate manifold 172, as taken along axes parallel to the die centerline 166. The TSVs 176 electrically couple the backside gate manifold 172 to a frontside gate contact structure 178 formed on the frontside 162 of the die body 190, as shown most clearly in FIG. 10 (discussed below). The TSVs 176 may extend through the die body 190 to contact regions of the backside gate manifold 172 and vertically-overlapping regions of the frontside gate contact structure 178; the term "vertically-overlapping" as appearing herein, referring to structures that partially align or overlap along axes parallel to the die centerline 166 (FIG. 7), Additionally, the below-described peaking transistor formed on the frontside 162 of the die body 190 may vertically-overlap the first backside bond pad structure 168 and/or the second backside bond pad structure 170.

In the illustrated embodiment, the TSVs 176 are arranged in small groupings or clusters, which are spaced at substantially equivalent intervals along the length of the backside gate manifold 172. In other embodiments, the number and spatial configurations of TSVs 176 may vary, or another type electrical interconnection features may be utilized to provide an electrical path from the die frontside 162 to the die backside 160. Wirebond arrays 138-1 (e.g., wirebonds from IPD 134-1 to the inverted peaking die 104) are further formed in contact with the backside bond pad structure 168

(e.g., with the bond pad extensions 174 near the edge of the die body 190) to provide electrical communication between the peaking input lead 124-1 (FIGS. 3 and 4) and the frontside gate contact structure 178, as previously described. In other embodiments, the gate bond pad structure 168 may lack the bond pad extensions 174, while the wirebonds in wirebond array 138-1 are formed directly in contact with the backside gate manifold 172; or the backside bond pad structure 168 may be replaced by a number of discrete structures, such as a series of separate bond pads spaced along the longitudinal axis of the peaking die 104. In this manner, the desired input/output (I/O) connections are established to the inverted peaking die 104 utilizing, for example, wirebonds and bond pads located on the passive side or backside 160 of the body 190 of the inverted peaking die 104.

The second frontside (drain) bond pad structure 170 is formed on the backside 160 of the inverted peaking die 104 at a location spatially offset from, and therefore electrically isolated from, the first (gate) bond pad structure 168. As indicated in FIG. 6, the second (drain) backside bond pad structure 170 may be substantially similar or identical to the first (gate) bond pad structure 168, although this is not necessary in all implementations. Accordingly, the backside bond pad structure 170 likewise includes an elongated body portion or "backside drain manifold" 180. A series of bond pad extensions 186 (again, only a few of which are labeled in FIGS. 6. and 7) project from a side of the backside drain manifold 180 toward an edge of the die 104 in a direction opposite the backside bond pad structure 168. The TSVs 184 are formed through the body 190 of the inverted peaking die 104 and electrically couple the backside drain manifold 180 to a frontside drain contact structure 182 present on the frontside 162 of the die body 190. Once again, the TSVs 184 are spaced along the length of the backside drain manifold 180 in the illustrated example, with various other spatial configurations possible. The wirebonds in wirebond array 138-2 are formed in contact with the bond pad extensions 186 to provide electrical communication between the peaking output lead 124-2 (FIGS. 3 and 4) and the frontside drain contact structure 182 through the second (drain) bond pad structure 170. In embodiments, the first (gate) bond pad structure 168 and the second (drain) bond pad structure 170 are formed in different portions of a patterned backmetal layer 168, 170, which may be composed of gold (Au), Cu, or another electrically-conductive material.

Figure 8:
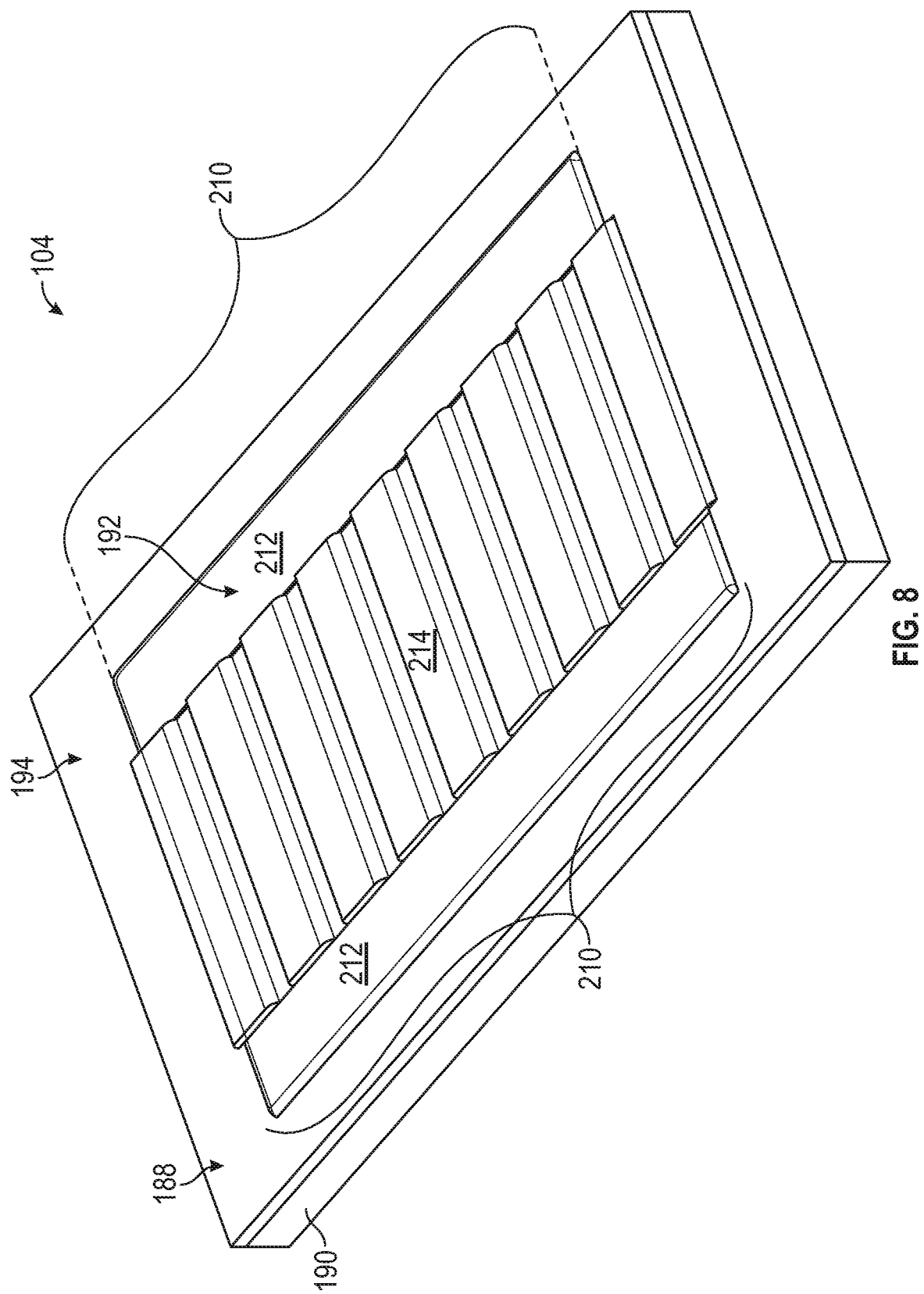
FIG. 8 is an isometric view of the frontside of the example inverted peaking die, as shown in FIGS. 3, 4, 6, and 7, more clearly illustrating an example frontside layer system suitably formed on the frontside of the die body.
Figure 9:
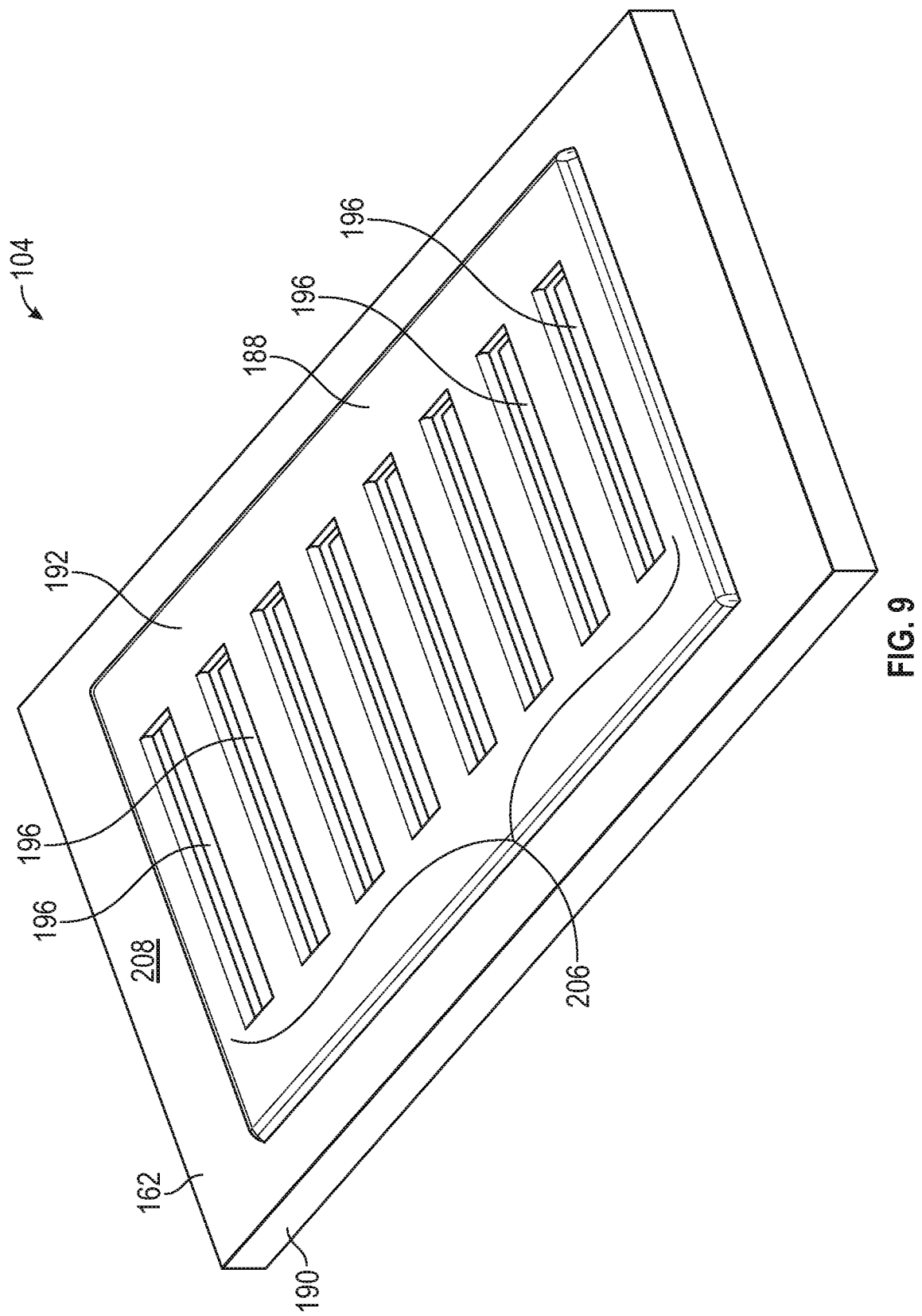
FIGS. 9 and 10 are isometric views of the example inverted peaking die, as illustrated with various layers stripped away from the frontside layer system.
Figure 10:
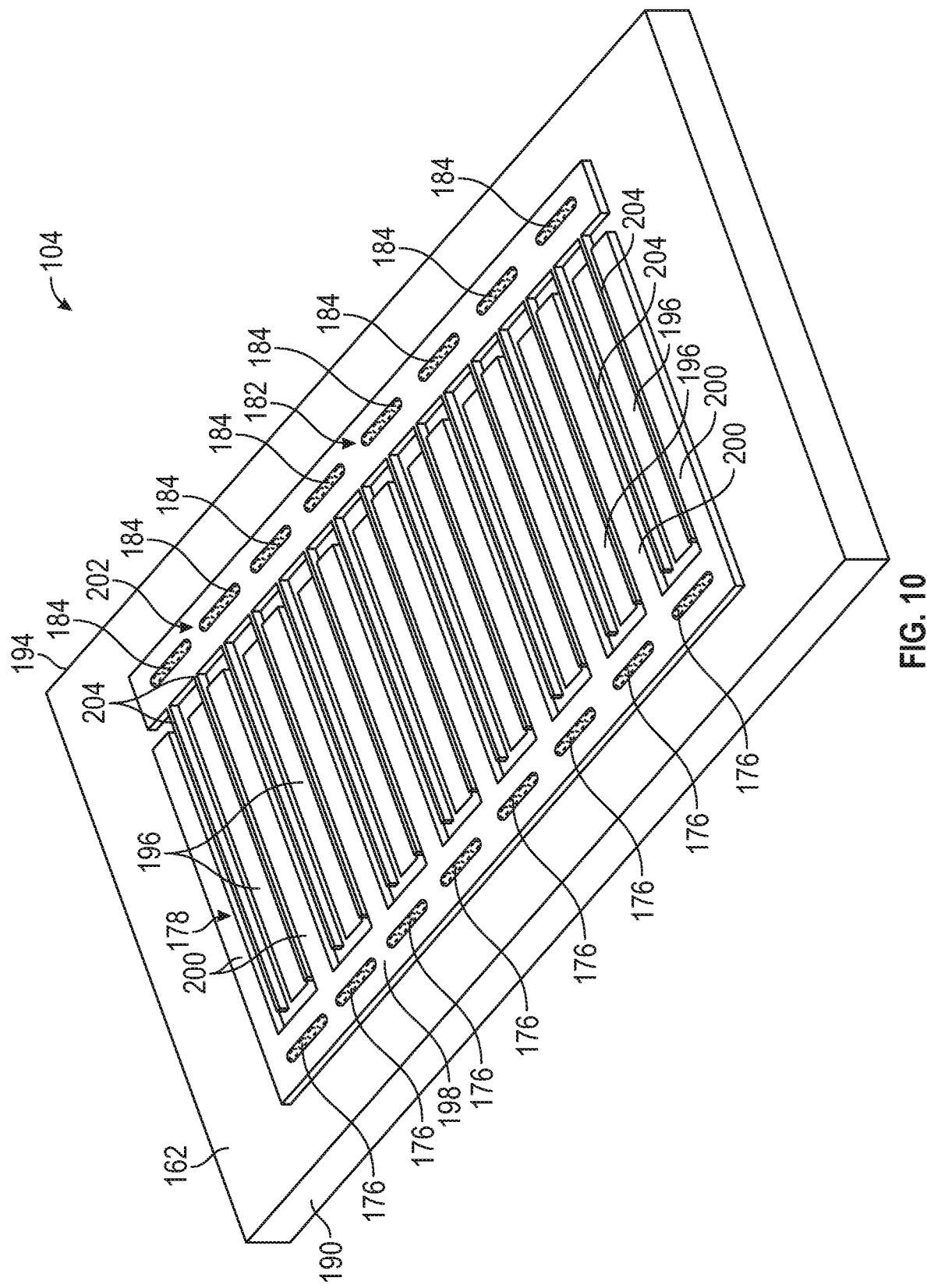

Referring also now to FIGS. 8-10, a frontside layer system 188 is formed over the frontside 162 of the inverted peaking die 104, The frontside layer system 188 of the example peaking die 104 may be produced to include: (i) the frontside gate contact structure 178 and the frontside drain contact structure 182, which may be collectively formed as a first patterned frontmetal layer 178, 182; (ii) a patterned frontside dielectric layer 192; and (iii) a second patterned frontmetal layer 194. In the illustrated example, the frontside layer system 188 includes only two patterned frontmetal layers; thus, first frontmetal layer 178, 182 is referred to as an "inner" patterned frontmetal layer, while second frontmetal layer 194 is referred to as an "outer" frontmetal layer below in view of the relative proximity of these layers to the body of the peaking die 104. This terminology is utilized in a non-limiting sense, noting that the frontside layer system 188 may include additional frontmetal layers in further embodiments.

The frontside gate contact structure 178 and the frontside drain contact structure 182 are most clearly shown in FIG. 10, along with a number of transistor contact regions 196 formed in the body 190 of the inverted peaking die 104, In illustrated example in which the peaking transistor is realized as a FET, transistor contact regions 196 are source regions of the FET and are consequently referred to below as such. This terminology is utilized in a non-limiting sense, however, again noting that the peaking transistor or transistors (as well as the carrier transistor(s) included in the PA device) can be implemented utilizing other transistor technologies in alternative embodiments. Additionally, while the inverted peaking die 104 and the carrier die 120 are contained in the same package 102 and joined to a common substrate (the base flange 112) in the illustrated example, this need not be the case in all implementations; e.g., in further embodiments, the dies 104, 120 may be contained in separate packages or modules combined in a single PA device.

As noted above, in the illustrated embodiment, the frontside layer system 188 is imparted with a relatively simplistic construction and contains a relatively small number of layers. The present example notwithstanding, the frontside layer system 188 may be considerably more complex in further implementations. In this regard, alternative embodiments of the frontside layer system 188 may include a greater number of electrically-conducive layers (e.g., four or more metal layers), which are patterned or otherwise formed to create the drain and gate contact structures described herein, as well as any desired electrical connections. Thus, in such alternative embodiments, the frontside layer system 188 may include additional frontmetal layers (and various dielectric layers, as appropriate) beyond the first patterned frontmetal layer 178, 182 and the second patterned frontmetal layer 194 included in the illustrated example.

With continued reference to FIGS. 8-10, and as best observed in FIG. 10, the frontside gate contact structure 178 of the frontside layer system 188 includes a conductive frontside gate manifold 198 from which a plurality of elongated gate contacts or fingers 200 extend (only a few of which are labeled). Similarly, the frontside drain contact structure 182 includes a conductive frontside drain manifold 202 from which a plurality of elongated drain contacts or drain lines 204 extend (again, only a few of which are labeled to avoid cluttering the drawing). The gate contact fingers 200 of the frontside gate contact structure 178 the drain lines 204 of the frontside drain contact structure 182, and the source regions 196 are interspersed in a comb-type arrangement (or interdigitated transistor finger arrangement) in the illustrated embodiment; e.g., such that each source region 196 is located between or laterally bordered by two of the drain lines 204, which are, in turn, located between or bordered by two of the gate contact fingers 200. Other transistor configurations are possible in further implementations.

During manufacture, the various regions of the body 190 of the inverted peaking die 104 are doped to create the source regions 196 and the drain regions, where the drain regions are formed to underly the drain lines 204 utilizing known techniques and fabrication processes. In this regard, in embodiments of the inverted peaking die 104, the source regions and the drain regions of the transistor structure are formed by targeted doping of selected, elongated regions arranged in an interdigitated relationship. Generally, the planform dimensions of the doped, interdigitated source and drain regions will correspond or approximate the planform dimensions of the drain lines 204 and the windows or openings 206 (FIG. 9) formed in the patterned frontside dielectric layer 192, as discussed more fully below. Comparatively, the gate contact fingers 200 (also referred to as "gate runners") extend over the body 190 of the inverted peaking die 104 between the source and drain regions as generally shown in FIGS. 8-10.

The TSVs 176, 184 are further formed in the appropriate region of the inverted peaking die 104 during fabrication of the inverted peaking die 104. As the inverted peaking die 104 will typically remain interconnected with a plurality of other dies in wafer form at this juncture of manufacture, the TSVs 176, 184 may be more specifically referred to as "through wafer vias" or "TWVs." At a subsequent juncture during manufacture, a metallic layer may be electroplated or otherwise deposited Over the frontside 162 of the inverted peaking die 104, which may remain physically interconnected with a plurality of other transistor-bearing PA dies in wafer form. The metallic layer may be patterned to define the contact structures 178, 182 shown in FIG. 10. Following this, the patterned frontside dielectric layer 192 is formed to cover the frontside gate contact structure 178 and the frontside drain contact structure 182. For example, the patterned frontside dielectric layer 192 may be deposited (e.g., by spin-on application) as a global layer and then patterned by photolithography in one approach. The structure shown in FIG. 9 results. In various embodiments, the patterned frontside dielectric layer 192 may cover the frontside gate contact structure 178 and the frontside drain contact structure 182, while further including a number of openings or windows 206 to allow physical access to the source regions 196 by the subsequently-deposited frontmetal layer 194 (described below). Further, if desired, and as labeled in FIG. 9, an outer peripheral border region 208 of the die frontside 162 may be left uncovered or exposed by the patterned frontside dielectric layer 192 to increase the surface area of the die frontside available for contact and bonding with the subsequently-deposited outer frontmetal layer 194. The frontside dielectric layer 192 may be composed of a resin, polymeric material (e.g., a polyimide or polytetrafluoroethylene (PTFE)), and other dielectric materials.

At the juncture of manufacture shown in FIG. 9, the patterned frontside dielectric layer 192 has been formed over the frontside gate contact structure 178 and the frontside drain contact structure 182. The patterned frontside dielectric layer 192 is usefully deposited to a thickness sufficient to provide adequate electrical isolation (and minimal capacitance) between the frontside gate contact structure 178, the frontside drain contact structure 182, and the subsequently-formed outer frontmetal layer 194, Accordingly, in embodiments, the frontside dielectric layer 192 may be deposited to have an average thickness exceeding the average thicknesses of the inner frontmetal layer 178, 182 (and therefore the average thicknesses of the frontside gate contact structure 178 and the frontside drain contact structure 182); and/or the average thicknesses of the outer frontmetal layer 194, as measured along the die centerline 166 (FIG. 7). Additionally or alternatively, the frontside dielectric layer 192 may be deposited to have an average thickness ranging from about 1 to about 20 microns (μm) or, perhaps, ranging from 2 to 10 μm, again as measured along the die centerline 166 (or along axes parallel thereto). In still other embodiments, the frontside dielectric layer 192 may be thicker or thinner than the aforementioned ranges.

Next, the outer frontmetal layer 194 is plated or otherwise deposited over the patterned frontside dielectric layer 192 to complete the frontside layer system 188, as shown in FIG. 8. The outer frontmetal layer 194 extends into the windows or openings 206 (FIG. 9) provided in the patterned frontside dielectric layer 192 to physically contact the source regions 196 of the peaking transistor formed on the frontside 162 of the peaking die body 190, Depending upon the deposition technique utilized, this may result in the creation of a central (e.g., a non-planar, undulating) region 214 in the outer frontmetal layer 194 due to the generally conformal deposition (e.g., electroplating) of the frontmetal layer 194 over a seed layer deposited (e.g., sputtered) over the grate-like patterned region of the frontside dielectric layer 1.92 covering the frontside gate contact structure 178 and the frontside drain contact structure:182. The outer frontmetal layer 194 may also contact and cover an outer peripheral border region 208 of the die frontside 162, which extends around or peripherally surrounds the patterned frontside dielectric layer 192. In this manner, a relatively large amount of surface area is availed for bonding the outer frontmetal layer 194 to the body 190 of the inverted semiconductor die 104, while a direct, robust electrical connection is created between the source regions 196 and the outer frontmetal layer 194; the distance between the transistor source regions 196 and the electrically-conductive bond layer 158 may be less than the average thickness of the die body 190, as measured along the die centerline 166, As shown in FIG. 10, the outer frontmetal layer 194 may include openings or windows 210 through which regions 212 of the patterned frontside dielectric layer 192 are exposed, if so desired. In other embodiments, the outer patterned frontmetal layer 194 may fully cover the patterned frontside dielectric layer 192; and/or the frontside layer system 188 may be formed to include additional dielectric, metallic, or other material layers.

At a suitable juncture following formation of the outer frontmetal layer 194, the peaking die 104 may be singulated if still interconnected with a number of other transistor dies as in wafer form. The inverted peaking die 104, along with the carrier die 120, may then be attached to the base flange 112 in the manner shown in FIGS. 3, 4, and 6. Attachment of the inverted peaking die 104 to the base flange 112 can be accomplished in any manner securing the peaking die 104 in its desired position, while establishing electrical communication (and perhaps efficient thermal transfer) between the peaking die 104 and the base flange 112. As indicated above, the electrically-conductive bond layer 158 may be utilized for die attachment purposes. The electrically-conductive bond layer 158 may be composed of a die attach material, solder, a sintered material, or another material suitable for bonding the inverted peaking die 104 to the flange 112, while providing electrical communication therebetween. Further discussion of the electrically-conductive bond layer 158 is provided below.

In embodiments, the electrically-conductive bond layer 158 is usefully imparted with a relatively high thermal conductivity (e.g., a thermal conductivity exceeding 30 watts per meter kelvin (W/mK)) in embodiments to allow efficient conductive heat transfer from the inverted peaking die 104 to the base flange 112. Candidate materials include, but are not limited to, metal-filled (e.g., silver—(Ag—), Au—, and Cu—filled) epoxies, solder materials (e.g., deposited solder pastes), and other die attach materials having the aforementioned properties. In one group of embodiments, the electrically-conductive bond layer 158 is formed from a sintered metallic material predominately composed of one or more metallic constituents, by weight percent In such embodiments, the bond layer 158 may be predominately composed of Cu, Ag, Au, or a mixture thereof; and may or may not contain organic materials. For example, the bond layer 158 is composed of a sintered metal (e.g., Ag or Cu) material having a thermal conductivity exceeding 50 W/mK and, perhaps, a thermal conductivity equal to or exceeding about 70 W/mK. Such sintered materials may also provide a strong metallurgical bond with not only the outer patterned frontmetal layer 194, but also with the upper surface 164 of the base flange 112, which may or may not be plated for enhanced bonding. As a still further advantage, the undulating central region 214 of the outer frontmetal layer 194 may boost the total surface area in contact with the electrically-conductive bond layer 158 to further enhance bonding between the inverted peaking die 104 and the base flange 112 through the bond layer 158.

The non-inverted carrier die 120 may be attached or mounted to the base flange 112 in a similar manner; that is, utilizing an electrically-conductive bond layer similar or identical to the above-described bond layer 158. After attachment of the dies 104, 120, wirebonding is performed to form wirebond arrays 136, 138 (FIG. 4) in the manner previously discussed. Notably, the bondwires within the wirebond arrays 138 (electrically coupled to the inverted peaking die 104) may be leveraged as inductive tuning elements, potentially with other conventional lumped or distributed tuning elements (e.g., other IPDs or surface mount device (SMD) capacitors) further utilized as desired. Generally, the circuit tuning of the peaking transistor IC will differ relative to the tuning of the carrier transistor IC due, at least in part, to variances in source inductance, ground inductance, capacitance between the drain and source (Cds), and other factors or parasitic values. In certain instances, some or all of the wirebonds included wirebond arrays 138 may be shorter in length than the wirebonds contained in the wirebond arrays 136 to compensate for the disparity in the electrical path length between (i) the transistor source region (s) of the peaking die 104 and the base flange 112, and (ii) the transistor source region(s) of the carrier die 120 and the flange 112. In other instances, this may not be the case. Electrical testing may be performed after wirebonding, followed by the above-discussed lid attachment process to yield the completed Doherty PA package 102 shown in FIG. 5.

In the above-described manner, inversion of the peaking die 104 within the Doherty PA package 102 enables the ratio of the active transistor dimensions (the transistor periphery or total active gate width) to be increased relative to the overall planform dimensions (width and length) of the peaking die 104. This is due, at least in part, to the relocation of the drain and gate bond pad. structures 168, 170 to the backside 160 of the peaking die 104. Additional area on the peaking die frontside 162 is consequently availed for enlargement of the peaking transistor size relative to the planform area of the die 104. A reduction in the planform area of the peaking die 104 is therefore permitted, while maintaining (or perhaps enlarging) the peaking transistor dimensions. Reducing the peaking die size in this manner can significantly lower the production cost of the peaking die 104, as previously described. Concurrently, reliability of the inverted peaking die 104 may be maintained at high levels due to the lower heat dissipation demands placed on the peaking die 104 as compared to the carrier die 120. As a further benefit, enhancements in device power gain may be achieved by lowering inductance between the source regions 196 of the peaking transistor and electrical ground, as coupled to the source regions 196 through the outer patterned frontmetal layer 194. A relatively direct, robust electrical path is therefore provided between the source regions 196 of the peaking transistor die 104 and the electrically-conductive base flange 112, which serves as a ground terminal of the Doherty PA package 102 in the illustrated example.

There has thus been provided an example embodiment of a symmetric, two-way, dual path Doherty PA package 102 containing two dies: an inverted peaking die 104 and a non-inverted carrier die 120. In further embodiments, the Doherty PA package (or, more broadly, the PA device) may assume other forms containing at least one inverted peaking die and at least one carrier die, which may or may not have an inverted orientation. As mentioned above in connection with the peaking die, factors weighing in favor of carrier die inversion may include a favorable increase in the active area availed for formation of the carrier transistor (or transistors) relative to the overall planform dimensions or size of the carrier die. Additionally, carrier die inversion may create a relatively direct, low inductance between contact (e.g., source) regions of the carrier transistor and the flange (ground), as previously noted. Factors weighing against the inversion of a carrier die (or dies) contained within a particular PA device can potentially include a diminished heat dissipation capacity of the die, depending upon the thermal conductivity of the carrier die itself. In instances in which the carrier die is partially or wholly composed of a semiconductor material (or materials) having a higher thermal conductivity, such as GaN grown on a SiC substrate, the benefits brought about by inversion of the carrier die may be outweighed by resulting thermal issues. Thus, in such instances, the carrier die may not be inverted. Conversely, in instances in which the carrier die is composed of a semiconductor material (e.g., GaAs) having a lower thermal conductivity, inversion of the carrier die may provide the aforementioned benefits, while the thermal performance of the carrier die remains at acceptable levels. Thus, in such instances, the carrier die may be inverted along with the peaking die (or dies) contained within the PA device.

Figure 11:
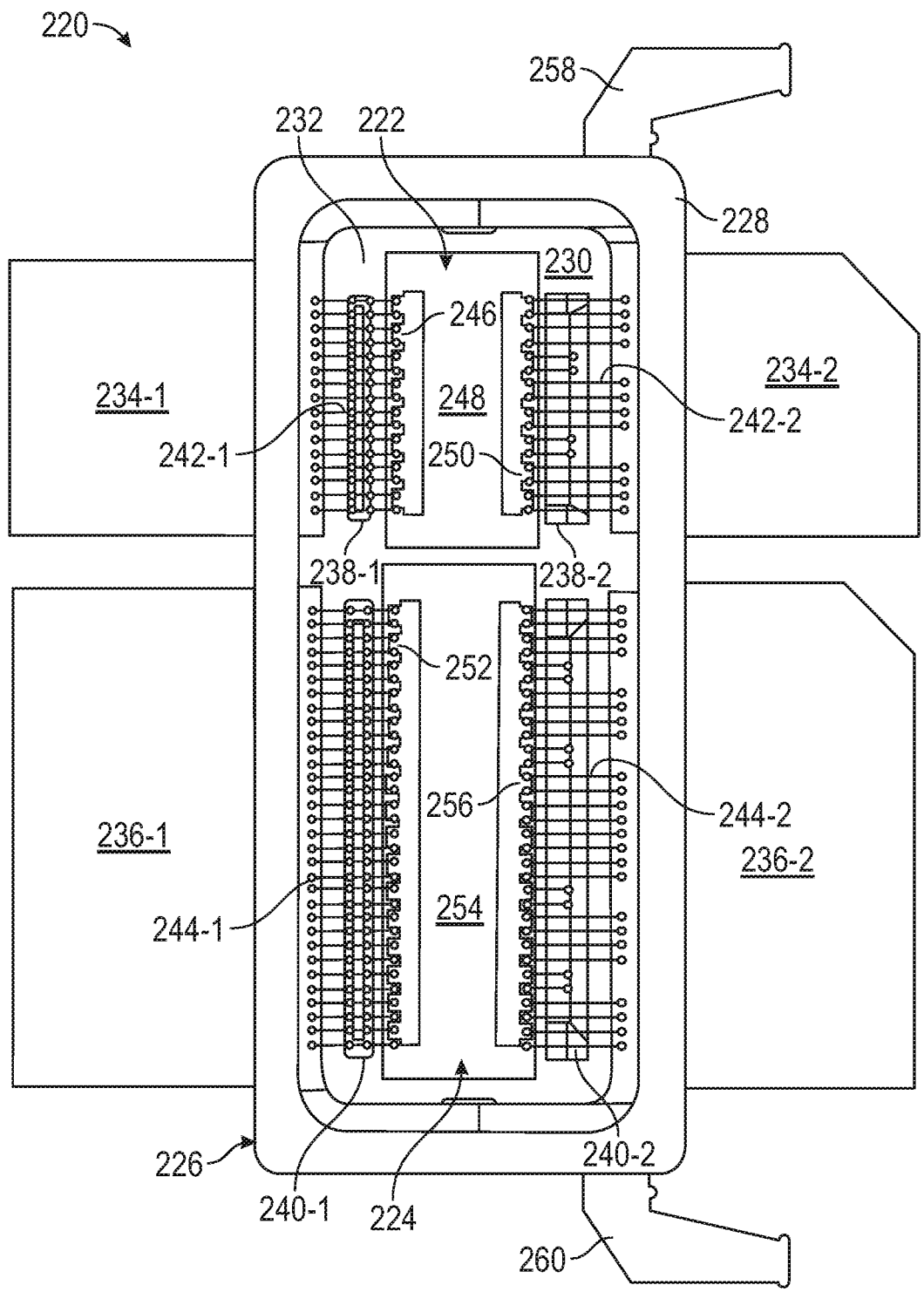
FIG. 11 is a top-down view of an asymmetric, two-way, dual path Doherty PA package containing an inverted peaking die and an inverted carrier die, as illustrated in accordance with a further example embodiment of the present disclosure.

Further emphasizing the points above, FIG. 11 is a top-down view of an asymmetric, two-way, dual path Doherty PA package 220 containing an inverted peaking die 224 in combination with an inverted carrier die 222, as illustrated in accordance with a further example embodiment of the present disclosure. As was the case with the example Doherty PA package 102 shown in FIGS. 3-10, the Doherty PA package 220 includes a package body 228 including peripheral package sidewalls 228 and an electrically-conductive base flange 230. The base flange 230 and the package sidewalls 228 partially bound an air cavity 232, which houses the inverted dies 222, 224. The dies 222, 224 are attached to the base flange 230 in a side-by-side relationship utilizing an electrically-conductive bonding material (not shown), which may be analogous to the electrically-conductive bond layer 158 described above in connection with FIGS. 6 and 7. A non-illustrated lid is attached to the upper edge of the package sidewalls 228 to complete package fabrication and sealingly enclose the air cavity 232, as previously discussed. Once again, the Doherty PA package 220 includes an input carrier lead 234-1, an input peaking lead 236-1, an output carrier lead 234-2, and an output peaking lead 236-2 projecting from opposing sides of the package body 228.

IPDs 238-1, 238-2, 2404, 240-2 (e.g., integrated capacitors) are further formed on or in the base flange 230; while a number of wirebond arrays 242-1, 242-2, 244-1, 244-2 are formed to interconnect the package leads 234, 236, the IPDs 238, 240, and the dies 222, 224. Specifically, wirebond array 242-1 electrically interconnects an inner edge of the carrier input lead 234-1, the input-side IPD 238-1, and a bond pad structure 246 provided on the backside 248 of the inverted carrier die 222; and the wirebond array 242-2 electrically interconnects an inner edge of the carrier output lead 234-2, the output-side IPD 238-2, and a bond pad structure 250 further provided on the backside 248 of the carrier die 222 to complete the carrier signal amplification path through the Doherty PA package 220. Similarly, the wirebond array 244-1 electrically interconnects an inner edge of the peaking input lead 236-1, the input-side IPD 240-1, and a bond pad structure 252 provided on the backside 254 of the inverted peaking die 224; and the wirebond array 242-2 electrically interconnects an inner edge of the carrier output lead 234-2, the output-side IPD 244-2, and a bond pad structure 266 further provided on the backside 248 of the peaking die 222 to complete the peaking signal amplification path through the package 220. Two bias leads 258, 260 further extend from opposing sides of the Doherty PA package 220.

In the embodiment of FIG. 11, the planform dimensions of the inverted peaking die 224 exceed those of the inverted carrier die 222. Correspondingly, the size (active periphery or total gate width) of the peaking transistor IC carried by the peaking die 224 is also increased (here, in approximately a 2:1 ratio) relative to the size of the carrier transistor IC formed on the carrier die 222. Additionally, the dimensions of the package leads 234, 236 and IPDs 238, 240 may also be varied along the longitudinal axis of the package 220, generally in relation to the lengths of the dies 222, 224. Accordingly, the peaking signal path leads 236 may be imparted with increased widths (relative to the carrier signal path leads 234) approximately corresponding to the length of inverted peaking die 224. So too may the IPDs 240 in the peaking signal path be imparted with increased widths generally corresponding to the length of inverted peaking die 224 and the widths of the peaking leads 236. Although not visible in FIG. 11, the packaged dies 222, 224 may each include TSVs and a frontside layer system similar or identical to those shown in FIGS. 6-10, with the foregoing description equally applicable to the example of FIG. 11 in this regard. By inverting the packaged dies 222, 224, the active area of the carrier and peaking transistors can be increased relative to the overall planform dimensions or footprints of the dies 222, 224. Thus, for a given package size, the transistors can be enlarged for increased performance; or, the packaged dies 222, 224 may be reduced in size to bring about a corresponding reduction in manufacturing costs with little to no impact on performance. Additionally, inversion of the packaged dies 222, 224 in this manner may provide a direct, low inductance electrical path between selected contact regions (e.g., the source regions) of the peaking and carrier transistors and the electrically-conductive base flange 230.

An Example Method for Manufacturing Inverted Peaking Dies and PA Devices Containing the Same From the wafer stage, the following process may be utilized to produce PA devices contained. inverted peaking dies in accordance with embodiments of the present disclosure. First, peaking transistors (e.g., FETs) may be fabricated across a device wafer utilizing conventional processing techniques. The frontside (e.g., gate and drain) contact structures may then be formed across the frontside of the device wafer and, therefore, on the frontsides of the various die making-up the wafer. The contact structures may be formed by electroplating or otherwise depositing one or more metal layers on the wafer frontside and then patterning the metal layers. As previously indicated, in further embodiments, a greater number of conductive layers (e.g., four or more metal layers) may be deposited onto the wafer frontside and patterned to create the frontside contact structures, depending upon the design complexity of the frontmetal system. Afterwards, the frontside dielectric layer is deposited to cover the frontside (e.g., gate and drain) contact structures, typically with the absence of bond pad formation on the frontside of the wafer; again noting that multiple frontside dielectric layers may be deposited in more complex embodiments of the inverted peaking die in which larger numbers of metal layers are utilized to construct the frontside contact structures. The outer patterned frontmetal layer may then be formed utilizing metal deposition and patterning techniques. With the exception of those features covered by frontside dielectric layer (e.g., the frontside contact structures), a majority of the frontside of the device wafer may be covered by unpassivated (exposed) metal serving as the outer patterned frontmetal layer. The wafer may then be inverted, and wafer thinning performed. If desired, TWVs may be formed at appropriate locations across the wafer to establish electrical interconnection between the respective frontsides and backsides of the dies. A patterned backmetal layer may be formed over the newly-thinned wafer backside to create the desired bond pad structures and TWV connections on the backsides of the dies, while interconnected in wafer form.

Next, the wafer is singulated (e.g., by dicing) to yield a plurality of individual dies, each having a patterned back-metal layer and a frontside layer system formed thereover. If desired, patterning may be performed to remove metal from the saw streets to enable low debris singulation in embodiments. Afterwards, product assembly may be conducted in the manner previously described. During assembly, the peaking die (or dies) are positioned in a face-down orientation when attached to an electrically-conductive base flange or other substrate. An electrically-conductive bond material, such as a die attach material, a sintered material, or a solder, may be utilized for die attachment purposes as previously described. The carrier die (or dies) may likewise be attached to the substrate at a location adjacent the peaking die (or dies) utilizing the electrically-conductive bond material. Wirebonding and other process steps (e.g., lidding for an air cavity package or over-molding for an encapsulated package) are then performed to complete fabrication of the PA device.

There has thus been provided PA devices incorporating inverted peaking dies and other associated structural features. In many instances, the inverted configuration may provide the lowest achievable die size for a given amount of transistor active area when, for example, the transistor die design is not significantly constrained by thermal considerations. Further, when implemented as a Doherty PA device, embodiments of the device can provide higher power gain for the peaking amplifier path relative to the carrier amplifier path in a Doherty PA. As the peaking amplifier is generally operated in a mode inherently having lower gain than the mode in which the carrier amplifier operates, the performance of a Doherty PA will often be limited by the power gain of the peaking path when the same transistor technology is utilized for both paths. This limitation is resolved by utilizing an inverted-die configuration for the peaking amplifier, as previously described. Additionally, the embodiments of the present disclosure present unique opportunities for significant die size reduction, with associated cost savings. As a still further advantage, embodiments of the above-described PA devices can be fabricated without the usage of specialized equipment and with relatively minor alterations or changes to existing process flows and facilitate adoption.

In various embodiments, the PA device includes a first set of input and output leads, an inverted first power transistor die electrically coupled between the first set of input and output leads, and a base flange to which the inverted first power transistor die is attached. The inverted first power die includes, in turn, a die body having a die frontside and a die backside opposite the die frontside, as taken along a centerline of the inverted second power transistor die. A power transistor having a first contact region is formed in the die frontside; the term "formed in" utilized in a general sense, noting that the doped regions of the transistor extend into the die body by some depth. A frontside layer system is formed over the die frontside and the power transistor, while an electrically-conductive bond layer contacts the frontside layer system to attach the inverted first power transistor die to the base flange. The first contact region of the power transistor is electrically coupled to the base flange through the electrically-conductive bond layer and through the frontside layer system. In certain implementations in which the inverted first power transistor die assumes the form of an inverted peaking die, the PA device may further include a carrier die attached to the base flange at a location adjacent the peaking die and electrically coupled between a second set of input and output leads.

Embodiments of an inverted power transistor die utilized with PA device have also been provided. In embodiments, the inverted power transistor die includes a die body having a die frontside and a die backside opposite the die frontside, as taken along a centerline of the inverted power transistor die. A power transistor, which has source and drain regions, is formed in the die frontside. A frontside layer system is further formed over the die frontside and over the power transistor. The frontside layer system includes a frontside drain contact structure electrically coupled to the drain regions of the power transistor, as well as a frontside gate contact structure. First and second backside bond pad structures are formed on the backside of the die body. Electrically-conductive vias are formed through the die body, electrically couple the frontside gate contact structure to the first backside bond pad structure, and further electrically couple the frontside drain contact structure to the second backside bond pad structure. In at least some implementations, the frontside layer system further includes: (i) a first frontmetal layer patterned to define the frontside gate contact structure and the frontside drain contact structure; (ii) a dielectric layer deposited over the first frontmetal layer; and (iii) a second frontmetal layer extending through openings provided in the dielectric layer to contact the source regions of the power transistor.

Method for fabricating PA devices have further been disclosed. In various implementations, the method includes the steps or process of fabricating, purchasing, or otherwise obtaining an inverted first power transistor die including: (i) a die body having a die frontside and a die backside opposite the die frontside, as taken along a centerline of the inverted first power transistor die; (ii) a power transistor formed in the die frontside and having a first contact region; and (iii) a frontside layer system formed over the die frontside. The method further includes the step or process of attaching the first power transistor die to a base flange utilizing an electrically-conductive bonding material, with the inverted first power transistor die attached to the base flange in an inverted orientation such that the frontside layer system is located between the die body and the base flange. In certain embodiments in which the inverted first power transistor die comprises an inverted peaking die, the method further includes attaching a carrier die to the base flange at a location adjacent the inverted peaking die.

While at least one example embodiment has been presented in the foregoing Detailed. Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements (e.g., package leads, transistors, and transistor-carrying die) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements,

What is claimed is:

1. A power amplifier (PA) device, comprising:
    first set of input and output leads;
    an inverted first power transistor die electrically coupled between the first set of input and output leads, the inverted first power transistor die comprising:
        a die body having a die frontside and a die backside opposite the die frontside, as taken along a centerline of the inverted first power transistor die;
        a power transistor having a first contact region formed in the die frontside; and
        a frontside layer system formed over the die frontside and the power transistor;
    a base flange to which the inverted first power transistor die is attached; and
    an electrically-conductive bond layer contacting the frontside layer system to attach the inverted first power transistor die to the base flange, the first contact region of the power transistor electrically coupled to the base flange through the electrically-conductive bond layer and through the frontside layer system.

2. The PA device of claim 1, wherein the inverted first power transistor die comprises an inverted peaking die; and
    wherein the PA device further comprises
        a second set of input and output leads; and
        a carrier die electrically coupled between the second set of input and output leads, the carrier die attached to the base flange at a location adjacent the inverted peaking die.

3. The PA device of claim 2, wherein the carrier die is attached to the base flange in an inverted orientation such that a frontside of the carrier die faces toward the base flange, as taken along the centerline.

4. The PA device of claim 2, wherein the carrier die is attached to the base flange in an inverted orientation such that a frontside of the carrier die faces toward the base flange, as taken along the centerline.

5. The PA device of claim 1, wherein the inverted first power transistor die further comprises:
    a first frontmetal layer overlying over the die frontside;
    a dielectric layer overlying the first frontmetal layer; and
    a second frontmetal layer overlying the dielectric layer and contacting the first contact region of the power transistor.

6. The PA device of claim 5, wherein the power transistor comprises a field effect transistor; and wherein the first contact region contacted by the second frontmetal layer comprises a source region of the field effect transistor.

7. The PA device of claim 5, wherein the first contact region of the power transistor is electrically coupled to the base flange through the electrically-conductive bond layer and through the second frontmetal layer.

8. The PA device of claim 5, wherein the second frontmetal layer contacts a majority of the die frontside, by surface area.

9. The PA device of claim 5, wherein the dielectric layer is patterned to define openings through the second frontmetal layer extends to contact the first contact region of the power transistor.

10. The PA device of claim 5, wherein the dielectric layer has an average thickness exceeding an average thickness of the first frontmetal layer, as measured along an axis parallel to the centerline.

11. The PA device of claim 5, wherein the first frontmetal layer is patterned to define a frontside gate contact structure and a frontside drain contact structure; and
wherein the PA device further comprises:
first and second backside bond pad structures formed on the die backside; and
at least one through substrate via electrically coupling the first and second backside bond pad structures to the frontside gate contact structure and to the frontside drain contact structure, respectively.

12. The PA device of claim 11, wherein at least one of the first backside bond pad structure and the second backside bond pad structure partially overlap with the power transistor, as taken along axes parallel to the centerline.

13. The PA device of claim 1, wherein a distance between the first contact region and the electrically-conductive bond layer is less than a thickness of the die body, as measured along the centerline.

14. An inverted power transistor die utilized within a power amplifier (PA) device, the inverted power transistor die comprising:
a die body having a die frontside and a die backside opposite the die frontside, as taken along a centerline of the inverted power transistor die;
a power transistor formed in the die frontside, the power transistor having source and drain regions;
a frontside layer system formed over the die frontside and the power transistor, the frontside layer system comprising:
a frontside drain contact structure electrically coupled to the drain regions of the power transistor; and
a frontside gate contact structure adjacent the frontside drain contact structure;
first and second backside bond pad structures formed on the backside of the die body; and
electrically-conductive vias formed through the die body, electrically coupling the frontside gate contact structure to the first backside bond pad structure, and electrically coupling the frontside drain contact structure to the second backside bond pad structure.

15. The inverted power transistor die of claim 14, wherein the frontside layer system further comprises:
a first frontmetal layer patterned to define the frontside gate contact structure and the frontside drain contact structure;
a dielectric layer overlying the first frontmetal layer; and
a second frontmetal layer overlying the dielectric layer, the second frontmetal layer extending through openings provided in the dielectric layer to contact the source regions of the power transistor.

16. A method for fabricating a power amplifier (PA) device, comprising:
obtaining an inverted first power transistor die, comprising:
a die body having a die frontside and a die backside opposite the die frontside, as taken along a centerline of the inverted first power transistor die;
a power transistor formed in the die frontside and having a first contact region; and
a frontside layer system formed over the die frontside; and
attaching the inverted first power transistor die to a base flange utilizing an electrically-conductive bonding material, the inverted first power transistor die attached to the base flange in an inverted orientation such that the frontside layer system is located between the die body and the base flange, as taken along the centerline.

17. The method of claim 16, wherein the inverted first power transistor die comprises an inverted peaking die; and
wherein the method further comprises attaching a carrier die to the base flange at a location adjacent the inverted peaking die.

18. The method of claim 16, wherein attaching comprises attaching the inverted first power transistor die to the base flange such that the first contact region of the power transistor is electrically coupled to the base flange through the electrically-conductive bond layer and through the frontside layer system.

19. The method of claim 16, wherein the inverted first power transistor die further comprises first and second backside bond pad structures formed over a backside of the die body; and
wherein the method further comprises electrically interconnecting the first and second backside bond pad structures with leads included in the PA device after attaching the inverted peaking die to the base flange.

20. The method of claim 16, further comprising forming the frontside layer system over the die frontside, forming comprising:
forming a first frontmetal layer over the die frontside;
forming a patterned dielectric layer over the first frontmetal layer; and
forming a second frontmetal layer over the patterned dielectric layer, the second frontmetal layer extending through at least one opening in the patterned dielectric layer to contact the first contact region of the power transistor.

* * * * *